(12) United States Patent
Furuta et al.

(10) Patent No.: US 8,040,271 B2
(45) Date of Patent: Oct. 18, 2011

(54) A/D CONVERSION APPARATUS, A/D CONVERSION METHOD, AND COMMUNICATION APPARATUS

(75) Inventors: Masanori Furuta, Odawara (JP); Tomohiko Ito, Yokohama (JP); Tetsuro Itakura, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 79 days.

(21) Appl. No.: 12/553,315

(22) Filed: Sep. 3, 2009

(65) Prior Publication Data

US 2010/0142653 A1 Jun. 10, 2010

(30) Foreign Application Priority Data

Dec. 5, 2008 (JP) ................................ 2008-310806

(51) Int. Cl.
*H03M 1/38* (2006.01)
(52) U.S. Cl. .......................... 341/172; 341/163
(58) Field of Classification Search .................. 341/161, 341/162, 163, 172
See application file for complete search history.

(56) References Cited

U.S. PATENT DOCUMENTS

| | | | |
|---|---|---|---|
| 6,124,818 A | 9/2000 | Thomas et al. | |
| 6,380,881 B2 | 4/2002 | Harada et al. | |
| 6,559,789 B1 * | 5/2003 | Somayajula | 341/172 |
| 6,958,722 B1 * | 10/2005 | Janakiraman et al. | 341/161 |
| 6,985,101 B2 * | 1/2006 | Leung et al. | 341/172 |
| 2005/0078026 A1 * | 4/2005 | Cai | 341/162 |
| 2008/0129573 A1 * | 6/2008 | Mueck et al. | 341/163 |
| 2010/0156683 A1 | 6/2010 | Nozawa et al. | |

FOREIGN PATENT DOCUMENTS

JP 2002-026731 1/2002

OTHER PUBLICATIONS

Khen-Sang Tan et al.; Error Correction Techniques for High-Performance Differential A/D Converters, IEEE Journal of Solid-State Circuits, vol. 25, No. 6, Dec. 1990; pp. 1318-1327.
Franz Kuttner; A 1.2V 10b 20MSample/s Non-Binary Successive Approximation ADC in 0.13 um CMOS, 2002 IEEE International Solid-State Circuits Conference; pp. 176-177.

* cited by examiner

*Primary Examiner* — Howard Williams
(74) *Attorney, Agent, or Firm* — Turocy & Watson, LLP

(57) ABSTRACT

An A/D conversion apparatus includes: a first and a second D/A converter to sample an analog signal and successively compare the analog signal and a reference signal to generate a first and a second comparison signal respectively; a first comparator to compare the first comparison signal generated by the first D/A converter with a benchmark signal; a second comparator to compare the second comparison signal generated by the second D/A converter with the benchmark signal; and a converter to convert the analog signal to a digital signal according to results of the comparisons by the first and second comparators.

11 Claims, 16 Drawing Sheets

Sample phase

Sample phase $S_a$ -> Off
$S_{1a}$ -> $V_r$
$S_{2a}$ -> GND
$S_{3a}$ -> -$V_r$
$S_{4a}, S_{5a}$ -> GND Comparison phase $S_b$ -> Off
$S_{1b}$ -> GND
$S_{2b}$ -> $V_r$
$S_{3b}$ -> GND
$S_{4b}$ -> $V_r$
$S_{5b}$ -> $V_r$ Comparison phase $S_c \rightarrow V_{com}$
$S_{1c}$ to $S_{M+1c} \rightarrow V_{inp}$ Sample Phase $S_d \rightarrow V_{com}$
$S_{1d}$ to $S1_{M+1d} \rightarrow V_{inp}$ Sample phase $S_c$ -> Off
$S_{1c}$ to $S_{M+1c}$ -> GND Hold phase $S_d$ -> Off
$S_{1d}$ to $S_{M+1d}$ -> GND Hold phase $S_c$ -> Off
$S_{1c}$ -> $V_r$
$S_{2c}$ to $S_{M+1c}$ -> GND Comparison phase $S_d$ -> Off
$S_{1d}$ -> $V_r$
$S_{2d}$ to $S_{M+1d}$ -> GND Comparison phase

A/D CONVERSION APPARATUS, A/D CONVERSION METHOD, AND COMMUNICATION APPARATUS

CROSS-REFERENCE TO RELATED APPLICATIONS

This application is based upon and claims the benefit of priority from the prior Japanese Patent Application No. 2008-310806, filed on Dec. 5, 2008; the entire contents of which are incorporated herein by reference.

BACKGROUND OF THE INVENTION

1. Field of the Invention

The present invention relates to an A/D conversion apparatus, an A/D conversion method, and a communication apparatus.

2. Description of the Related Art

A conventional successive approximation type A/D (Analog/Digital) conversion apparatus uses a 1 bit/stage algorithm and hence is easily influenced by an offset voltage generated in a comparator or an OP amplifier (operational amplifier). Therefore, there has been proposed an A/D conversion apparatus using a redundant algorithm allowing precision relaxation of a capacitive D/A converter (JP-A 2002-26731(KOKAI)).

BRIEF SUMMARY OF THE INVENTION

However, in the conventional A/D conversion using the redundant algorithm, a radix is a value smaller than 2. Therefore, such an A/D converting apparatus needs more time for the A/D conversion than an A/D conversion apparatus whose radix is 2. Moreover, circuits such as a multiplier and an adder for 1-bit conversion of an output result are necessary. This leads to an increase in circuit area and power consumption. The present invention was made to solve such problems, and has an object to provide an A/D conversion apparatus an A/D conversion method, and a communication apparatus having redundancy yet capable of high-speed A/D conversion.

An A/D conversion apparatus according to one aspect of the present invention includes: a first and a second D/A converter to sample an analog signal and successively compare the analog signal and a reference signal to generate a first and a second comparison signal respectively; a first comparator to compare the first comparison signal generated by the first D/A converter with a bench mark signal; a second comparator to compare the second comparison signal generated by the second D/A converter with the benchmark signal; and a converter to convert the analog signal to a digital signal according to results of the comparisons by the first and second comparators.

DETAILED DESCRIPTION OF THE INVENTION

Hereinafter, embodiments of the present invention will be described in detail with reference to the drawings.

First Embodiment

First, a difference between the input/output characteristics of the conventional A/D conversion apparatus and the input/output characteristic of the A/D conversion apparatus 1 according to the first embodiment will be described with reference to FIG. 1A to FIG. 1C and FIG. 2. Only the input/output characteristic of the most significant bit (MSB) is shown in FIG. 1A to FIG. 1C and FIG. 2. In FIG. 1A to FIG. 1C and FIG. 2, the vertical axis represents an output signal and the horizontal axis represents an input signal.

Figure 1A:
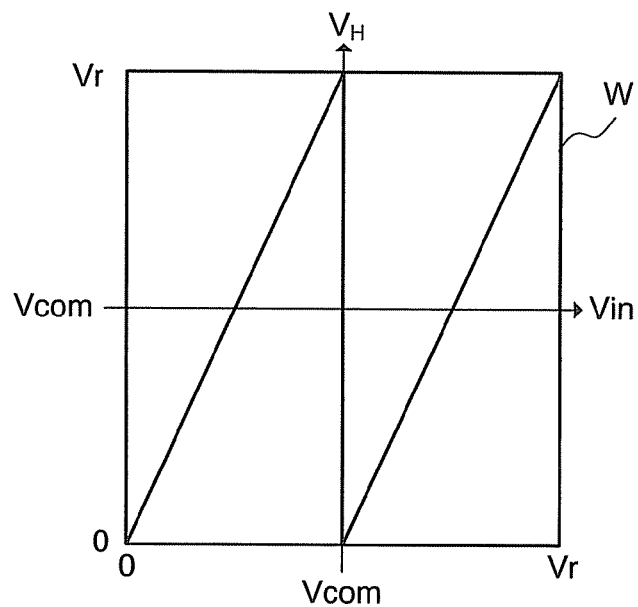
FIG. 1A is a chart showing a conventional input/output characteristic.
Figure 1B:
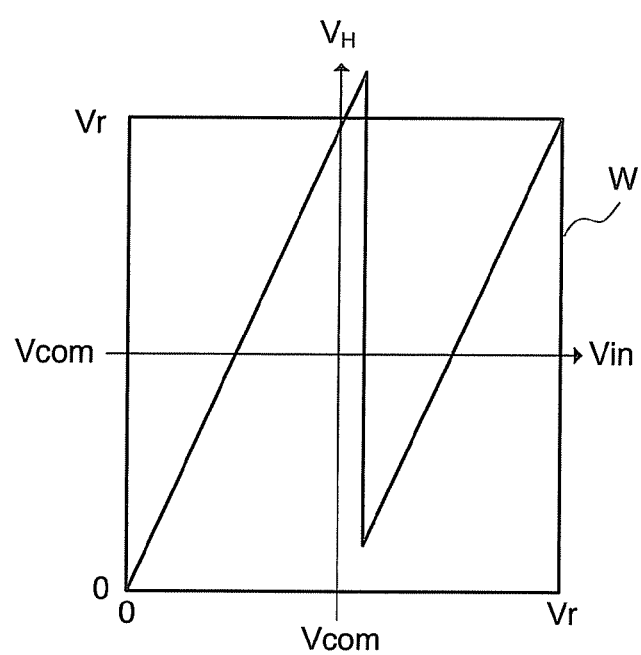
FIG. 1B is a chart showing a conventional input/output characteristic.

The conventional A/D conversion apparatus uses a 1-bit (binary) algorithm whose radix is 2. As shown in FIG. 1A, the output signal increases in proportion to the input signal. Then, the output signal turns down when the input signal takes a $V_{com}$ value. Then, when the input signal takes a value higher than the $V_{com}$ value, the output signal increases in proportion to the input signal again. However, in the 1-bit algorithm, linearity of the turn-down characteristic is likely to be affected by an offset voltage of a comparator or an OP amplifier (operational amplifier) to deteriorate. For example, when there is an offset voltage in the comparator or the like, the input/output characteristic goes out of a range W in which normal A/D conversion is possible as shown in FIG. 1B. In the outside range, since a conversion value is clipped, the normal A/D conversion is not possible.

Figure 1C:
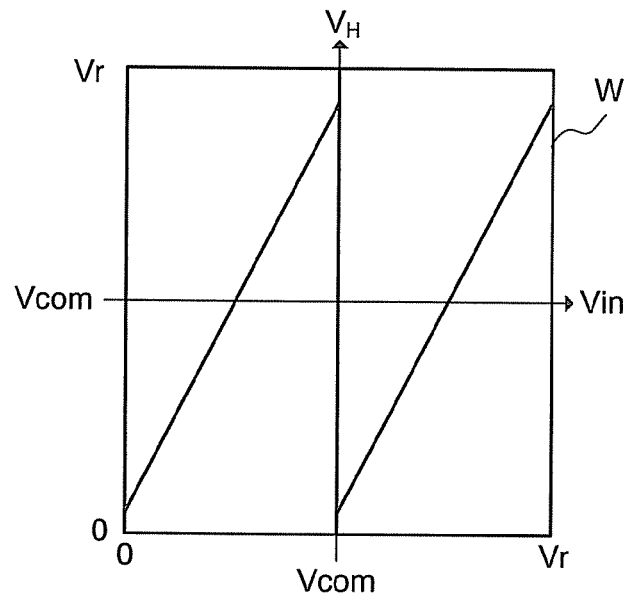
FIG. 1C is a chart showing a conventional input/output characteristic.

Therefore, there is an A/D conversion apparatus having redundancy by changing a gradient of the output signal relative to the input signal as shown in FIG. 1C. In this A/D conversion apparatus, even when there is an offset voltage in a comparator or the like, it is possible to prevent the input/output characteristic from going out of the range W in which the normal A/D conversion is possible.

However, when the gradient is changed, the radix becomes a value smaller than 2 such as 1.85 instead of 2. In order to obtain the same number of bits, such an A/D conversion apparatus requires more time for the conversion than an A/D conversion apparatus whose radix is 2. For example, when it is desired to obtain a 10-bit output, the conversion cycle needs to be repeated 12 times or more since 1024>1.85¹². Further, circuits such as a multiplier, an adder, and the like are necessary for the 1-bit conversion of the output result. This leads to an increase in circuit area and power consumption.

The A/D conversion apparatus 1 according to the first embodiment, on the other hand, is free from the aforesaid problems since it uses a 1.5 bit/stage algorithm for the A/D conversion. Hereinafter, the reason will be explained with reference to FIG. 2.

Figure 2:
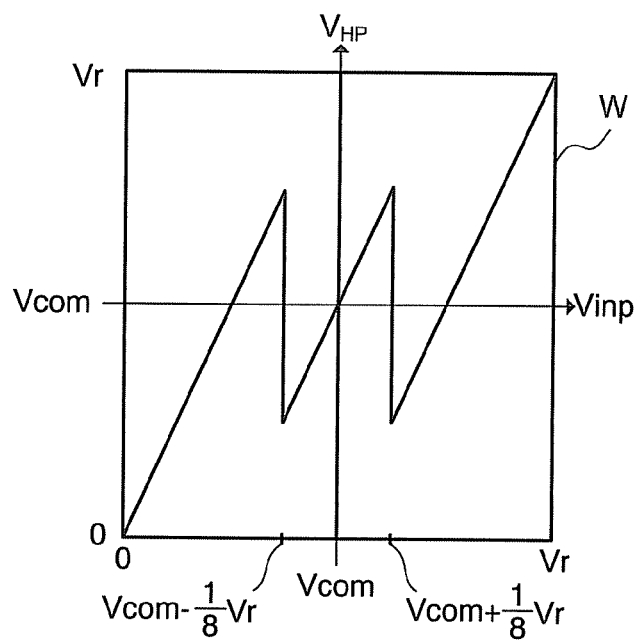
FIG. 2 is a chart showing an input/output characteristic according to a first embodiment.

As shown in FIG. 2, the 1.5 bit/stage algorithm is characterized in that the turn-down point is set at two points of the input signal, that is, $V_{com}+⅛V_r$ and $V_{com}-⅛V_r$ instead of $V_{com}$. Thus setting the two turn-down points makes it possible to effectively prevent the input/output characteristic from going out of the range W in which the normal A/D conversion is possible even if the input/output characteristic shifts due to an offset voltage generated in a comparator or an OP amplifier. Further, the 1-bit conversion of the obtained output result is enabled only with an adder. This can prevent an increase in circuit area and power consumption.

The 1.5 bit/stage algorithm can be realized by the use of three voltages $+V_r$, $-V_r$, and ground (GND) as an output of a D/A converter (digital/analog converter). These three voltages are changed over by a switch. Incidentally, the ground voltage is an example of a reference voltage, and voltages different from $+V_r$ and $-V_r$ may be used.

Figure 3:
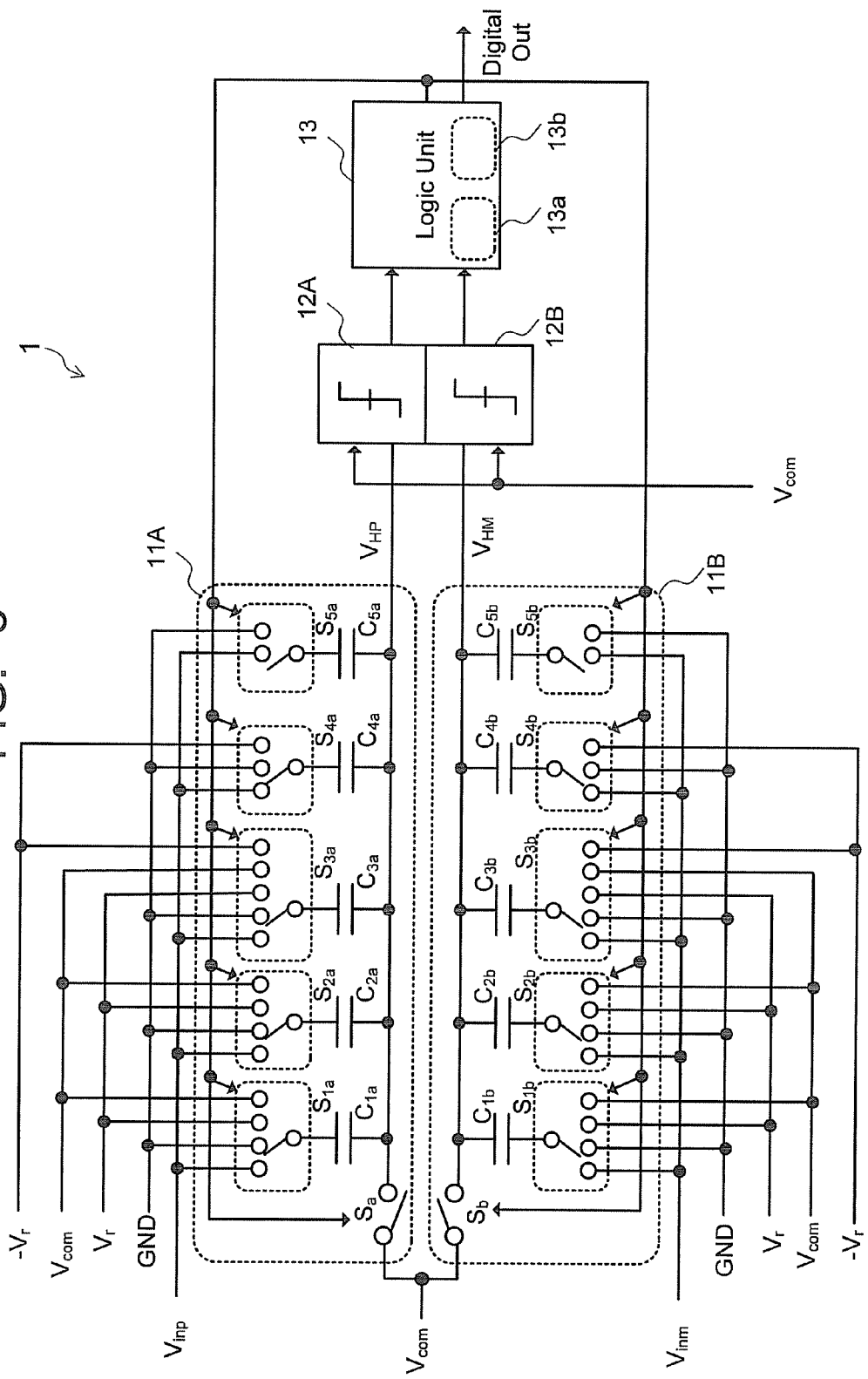
FIG. 3 is a block diagram of an A/D conversion apparatus according to the first embodiment.

Based on the above, the A/D conversion apparatus 1 according to the first embodiment will be described. FIG. 3 is a view showing the structure of the A/D conversion apparatus 1 according to the first embodiment. In the first embodiment, the A/D conversion apparatus 1 having 4-bit resolution will be described. The A/D conversion apparatus 1 is formed by a differential circuit.

The A/D conversion apparatus 1 includes a capacitive DAC 11A (first D/A converter), a capacitive DAC 11B (second D/A converter), a comparator 12A (first comparator), a comparator 12B (second comparator), and a logic unit 13 (first converter).

The capacitive DAC 11A includes switches $S_a$, $S_{1a}$ to $S_{5a}$ and capacitors $C_{1a}$ to $C_{5a}$. One end of the switch $S_a$ is connected to $V_{com}$ supplying a reference voltage. The other end of the switch $S_a$ is connected to one-side ends of the capacitors $C_{1a}$ to $C_{5a}$.

One end of the switch $S_{1a}$ is connected to the other end of the capacitor $C_{1a}$. The other end of the switch $S_{1a}$ is connected selectively to the ground (hereinafter referred to as GND), $V_{com}$ and $V_r$ supplying reference voltages, and $V_{inp}$ supplying an input voltage (plus: positive side) of the analog signal.

One end of the switch $S_{2a}$ is connected to the other end of the capacitor $C_{2a}$. The other end of the switch $S_{2a}$ is connected selectively to GND, $V_{com}$, $V_r$, and $V_{inp}$.

One end of the switch $S_{3a}$ is connected to the other end of the capacitor $C_{3a}$. The other end of the switch $S_{3a}$ is connected selectively to GND, $V_{com}$, $V_r$, $-V_r$, and $V_{inp}$.

One end of the switch $S_{4a}$ is connected to the other end of the capacitor $C_{4a}$. The other end of the switch $S_{4a}$ is connected selectively to GND, $-V_r$, and $V_{inp}$.

One end of the switch $S_{5a}$ is connected to the other end of the capacitor $C_{5a}$. The other end of the switch $S_{5a}$ is connected selectively to GND and $V_{inp}$.

Capacitance values of the capacitors $C_{1a}$ to $C_{5a}$ are binary-weighted. Capacitance ratios of the capacitors $C_{1a}$ to $C_{5a}$ are ½, ¼, ⅛, ⅟16, and ⅟16 respectively. A unit of the capacitance is farad (F).

The connection of the switches $S_a$, $S_{1a}$ to $S_{5a}$ is changed according to a control signal output from the logic unit 13. The capacitive DAC 11A has a function of generating an analog voltage $V_{HP}$ (first comparison signal) based on a voltage of $V_{inp}$ while holding $V_{inp}$, by changing the connection destinations of the other ends of the switches $S_a$, $S_{1a}$ to $S_{5a}$ according to the control signal given from the logic unit 13.

The capacitive DAC 11B includes switches $S_b$, $S_{1b}$ to $S_{5b}$ and capacitors $C_{1b}$ to $C_{5b}$. One end of the switch $S_b$ is connected to $V_{com}$. The other end of the switch $S_b$ is connected to one-side ends of the capacitors $C_{1b}$ to $C_{5b}$.

One end of the switch $S_{1b}$ is connected to the other end of the capacitor $C_{1b}$. The other end of the switch $S_{1b}$ is connected selectively to GND, $V_{com}$, $V_r$, and $V_{inm}$ supplying an input voltage (minus: negative side) of the analog signal.

One end of the switch $S_{2b}$ is connected to the other end of the capacitor $C_{2b}$. The other end of the switch $S_{2b}$ is connected selectively to GND, $V_{com}$, $V_r$, and $V_{inm}$.

One end of the switch $S_{3b}$ is connected to the other end of the capacitor $C_{3b}$. The other end of the switch $S_{3b}$ is connected selectively to GND, $V_{com}$, $V_r$, $-V_r$, and $V_{inm}$.

One end of the switch $S_{4b}$ is connected to the other end of the capacitor $C_{4b}$. The other end of the switch $S_{4b}$ is connected selectively to GND, $-V_r$, and $V_{inm}$.

One end of the switch $S_{5b}$ is connected to the other end of the capacitor $C_{5b}$. The other end of the switch $S_{5b}$ is connected selectively to GND and $V_{inm}$.

Capacitance values of the capacitors $C_{1b}$ to $C_{5b}$ are binary-weighted. Capacitance ratios of the capacitors $C_{1b}$ to $C_{5b}$ are ½, ¼, ⅛, ⅟16, and ⅟16 respectively. A unit of the capacitance is farad (F).

The connection of the switches $S_b$, $S_{1b}$ to $S_{5b}$ is changed according to the control signal output from the logic unit 13. The capacitive DAC 11B has a function of generating an analog voltage $V_{HM}$ (second comparison signal) based on a voltage of $V_{inm}$ while holding $V_{inm}$, by changing the connection destinations of the other ends of the switches $S_b$, $S_{1b}$ to $S_{5b}$ according to the control signal given from the logic unit 13.

The comparator 12A compares the analog voltage $V_{HP}$ generated by the capacitive DAC 11A and a benchmark voltage $V_{com}$ (benchmark signal) to output the comparison result to the logic unit 13.

The comparator 12B compares the analog voltage $V_{HM}$ generated by the capacitive DAC 11B and the benchmark voltage $V_{com}$ (benchmark signal) to output the comparison result to the logic unit 13.

The logic unit 13 includes a memory 13a storing analog/digital conversion values and an adder 13b performing 1-bit conversion of 1.5 bit calculation results. The logic unit 13 generates the control signal controlling the switches of the capacitive DACs 11A, 11B, based on the analog/digital conversion values generated by the comparators 12A, 12B.

The adder 13b adds "1" to high-order bits to lower-order bits of the obtained calculation result. For example, when 1.5-bit results "1", "0", and "−1" are obtained, the adder 13b converts them to 2-bit values "10", "1", and "0". Thus, according to the 1.5 bit/stage algorithm, a binary output having N+1 bits is obtained by repeating the conversion N times (N is a positive integer). Another alternative structure may be that the adder 13b is not provided in the logic unit 13 and the 1-bit binary conversion is performed in an external part of the A/D conversion apparatus 1.

The characteristics of the A/D conversion apparatus 1 lie in that a capacitance generally realized by C/8 is realized by the two C/16, $V_{com}$ and $-V_r$ are additionally set as the reference voltages, the switches connecting the capacitors (capacitances) to $V_{com}$ and $-V_r$ are additionally provided, and the 1.5 bit/stage comparators are used as the comparators. Further, $V_{com}$ is $V_r/2$. It is assumed that a full scale of a voltage amplitude of the input signal is $V_r$ and the amplitude vibrates with respect to $V_{com}$.

Next, the operation will be described with reference to FIG. 4A to FIG. 6B. In FIG. 4A to FIG. 6B, the illustration of the switches is omitted.

The A/D conversion apparatus 1 according to the first embodiment operates to repeat three phases: the signal sample phase, the hold phase, and the comparison phase shown in FIG. 4A to FIG. 6B. The logic unit 13 generates the control signal controlling the switches $S_a$ to $S_{5a}$ and $S_b$ to $S_{5b}$. Hereinafter, the operations of the A/D conversion apparatus 1 in the three phases will be described in detail.

Figure 4A:
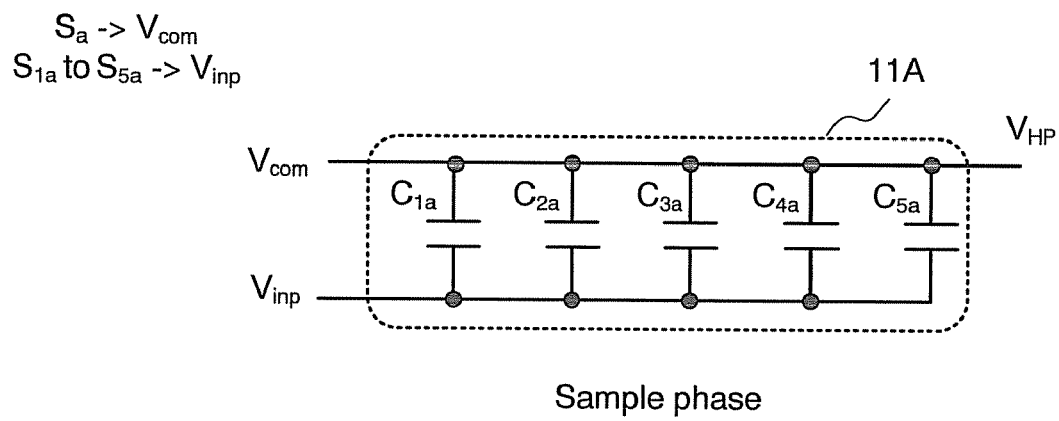
FIG. 4A is a view showing a capacitive DAC in a sample phase.

The operation of the capacitive DAC 11A side will be described. As shown in FIG. 4A, in the signal sample phase, the switch $S_a$ connects the one-side ends of the capacitors $C_{1a}$ to $C_{5a}$ to $V_{com}$. The switches $S_{1a}$ to $S_{5a}$ connect the other ends of the capacitors $C_{1a}$ to $C_{5a}$ to $V_{inp}$ respectively.

At this time, electric charge Qa accumulated in the capacitors $C_{1a}$ to $C_{5a}$ is given by the following equation (1), where Ca is the total capacitance of the capacitors.

$$Qa = Ca(V_{inp} - V_{com}) \quad (1)$$

Figure 4B:
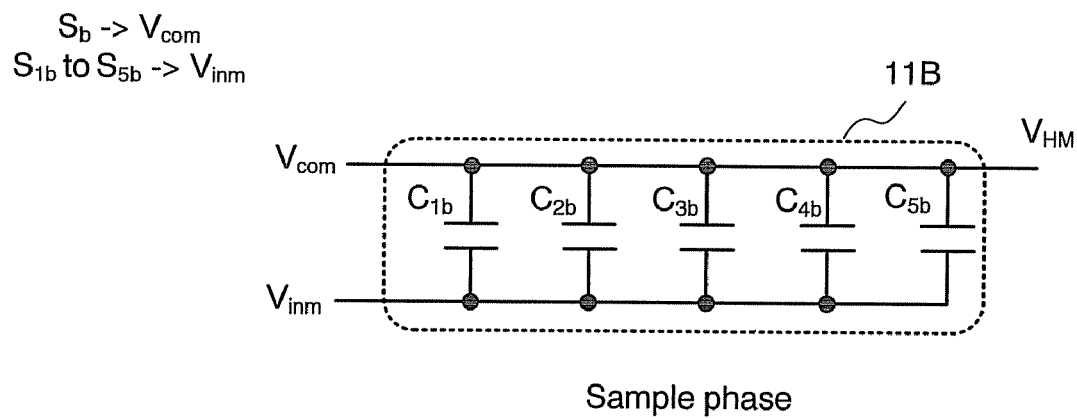
FIG. 4B is a view showing a capacitive DAC in the sample phase.

Next, the operation of the capacitive DAC 11B side will be described. As shown in FIG. 4B, in the signal sample phase, the switch $S_b$ connects the one-side ends of the capacitors $C_{1b}$ to $C_{5b}$ to $V_{com}$. The switches $S_{1b}$ to $S_{5b}$ connect the other ends of the capacitors $C_{1b}$ to $C_{5b}$ to $V_{inm}$ respectively.

At this time, electric charge Qb accumulated in the capacitors $C_{1b}$ to $C_{5b}$ is given by the following equation (2), where Cb is the total capacitance of the capacitors.

$$Qb = Cb(V_{inm} - V_{com}) \quad (2)$$

Figure 5A:
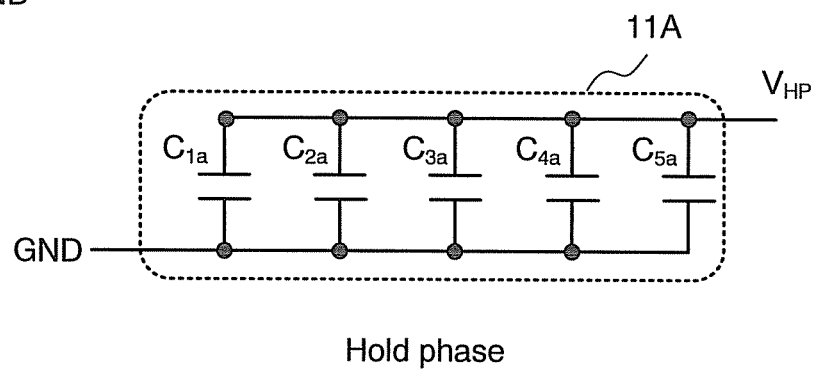
FIG. 5A is a view showing the capacitive DAC in a hold phase.

The operation of the capacitive DAC 11A side will be described. As shown in FIG. 5A, in the hold phase, the switch $S_a$ turns off the connection between the one-side ends of the capacitors $C_{1a}$ to $C_{5a}$ and $V_{com}$. The switches $S_{1a}$ to $S_{5a}$ connect the other ends of the capacitors $C_{1a}$ to $C_{5a}$ to GND. At this time, the voltage $V_{HP}$ of the one-end sides of the capacitors $C_{1a}$ to $C_{5a}$ shifts by $(V_{inp} - V_{com})$ to become $-(V_{inp} - V_{com})$.

Figure 5B:
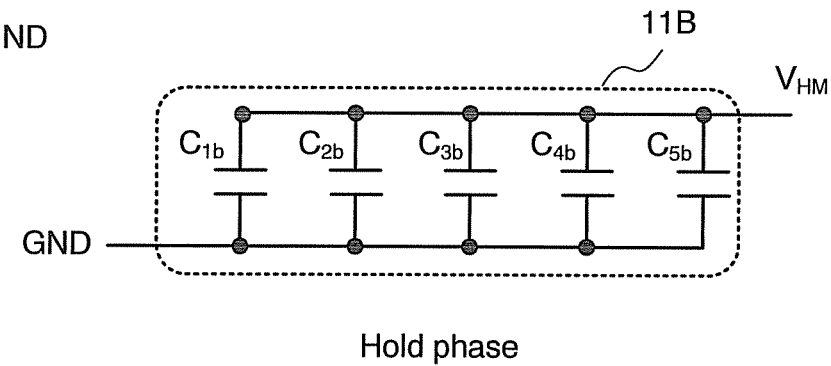
FIG. 5B is a view showing the capacitive DAC in the hold phase.

Next, the operation of the capacitive DAC 11B side will be described. As shown in FIG. 5B, in the hold phase, the switch $S_b$ turns off the connection between the one-side ends of the capacitors $C_{1b}$ to $C_{5b}$ and $V_{com}$. The switches $S_{1b}$ to $S_{5b}$ connect the other ends of the capacitors $C_{1b}$ to $C_{5b}$ to GND. At this time, the voltage $V_{HP}$ of the one-end sides of the capacitors $C_{1b}$ to $C_{5b}$ shifts by $(-V_{inm} - V_{com})$ to become $-(V_{inm} - V_{com})$.

Figure 6A:
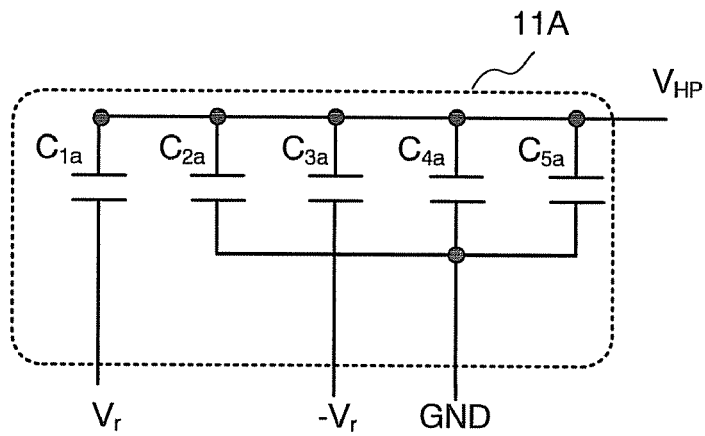
FIG. 6A is a view showing the capacitive DAC in a comparison phase.

The comparison phase of the most significant bit (MSB) will be described. First, the operation of the capacitive DAC 11A side will be described. As shown in FIG. 6A, the switch $S_{1a}$ connects the other end of the capacitor $C_{1a}$ to $V_r$. The switch $S_{3a}$ connects the other end of the capacitor $C_{3a}$ to $-V_r$. The switches $S_{2a}$, $S_{4a}$, $S_{5a}$ connect the other ends of the capacitors $C_{2a}$, $C_{4a}$, $C_{5a}$ to GND respectively. At this time, the voltage $V_{HP}$ output from the capacitive DAC 11A is given by the following equation (3).

$$V_{HP} = -V_{inp} + \tfrac{1}{2}V_r - \tfrac{1}{8}V_r + V_{com} \quad (3)$$

Figure 6B:
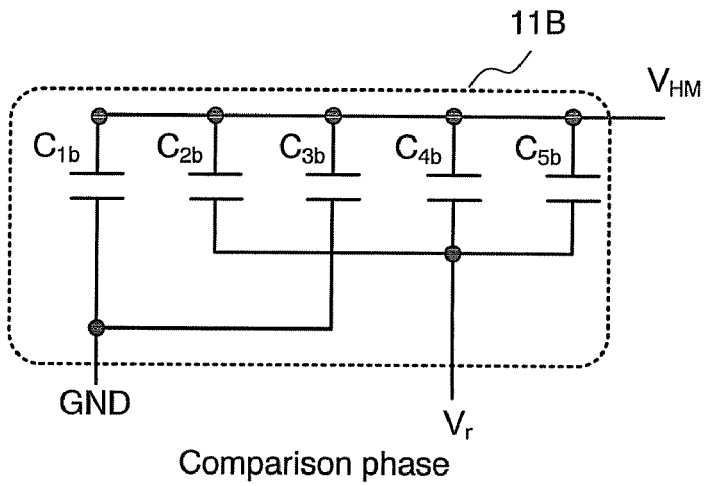
FIG. 6B is a view showing the capacitive DAC in the comparison phase.

Next, the operation of the capacitive DAC 11B side will be described. As shown in FIG. 6B, the switches $S_{1b}$, $S_{3b}$ connect the other ends of the capacitors $C_{1b}$, $C_{3b}$ to GND. The switches $S_{2b}$, $S_{4b}$, $S_{5b}$ connect the other ends of the capacitors $C_{2b}$, $C_{4b}$, $C_{5b}$ to $V_r$ respectively. At this time, the voltage $V_{HM}$ output from the capacitive DAC 11B is given by the following equation (4).

$$V_{HM} = -V_{inm} + \tfrac{1}{2}V_r - \tfrac{1}{8}V_r + V_{com} \quad (4)$$

Here, $V_{inp}$ is a signal whose amplitude varies relative to GND. $V_{inm}$ is a signal whose amplitude varies relative to $V_r$. Further, let $V_{inp} = A_m$ and $V_{inm} = V_r - A_m$, the following equations (5), (6) hold, where $A_m$ is a signal amplitude of each of $V_{inp}$ and $V_{inm}$.

$$V_{HP} = -A_m + \tfrac{1}{2}V_r - \tfrac{1}{8}V_r + V_{com} \quad (5)$$

$$V_{HM} = A_m - \tfrac{1}{2}V_r - \tfrac{1}{8}V_r + V_{com} \quad (6)$$

Next, the comparator 12A compares $V_{HP}$ and $V_{com}$ to output the comparison result to the logic unit 13. Further, the comparator 12B compares $V_{HM}$ and $V_{com}$ to output the comparison result to the logic unit 13.

The logic unit 13 changes the connection destination of the switch $S_{1a}$ according to the comparison results by the comparators 12A, 12B. The connection destination is decided, depending on the following conditions.

$0(GND) < V_{inp} < \tfrac{1}{2}V_r - \tfrac{1}{8}V_r$     Condition 1

$\tfrac{1}{2}V_r - \tfrac{1}{8}V_r \leq V_{inp} \leq \tfrac{1}{2}V_r + \tfrac{1}{8}V_r$     Condition 2

$\tfrac{1}{2}V_r + \tfrac{1}{8}V_r < V_{inp} \leq V_r$     Condition 3

Under the condition 1, the logic unit 13 controls the switch $S_{1a}$ to connect the other end of the capacitor $C_{1a}$ to $V_r$. Under the condition 2, the logic unit 13 controls the switch $S_{1a}$ to connect the other end of the capacitor $C_{1a}$ to $V_{com}$. Under the condition 3, the logic unit 13 controls the switch $S_{1a}$ to connect the other end of the capacitor $C_{1a}$ to GND.

Further, the logic unit 13 changes the connection destination of the switch $S_{1b}$ according to the comparison results by the comparators 12A, 12B. The connection destination is decided, depending on the following conditions.

$\tfrac{1}{2}V_r + \tfrac{1}{8}V_r < V_{inm} < V_r$     Condition 4

$0(GND) < V_{inm} < \tfrac{1}{2}V_r - \tfrac{1}{8}V_r$     Condition 5

$\tfrac{1}{2}V_r - \tfrac{1}{8}V_r \leq V_{inm} \leq \tfrac{1}{2}V_r + \tfrac{1}{8}V_r$     Condition 6

Under the condition 4, the logic unit 13 controls the switch $S_{1b}$ to connect the other end of the capacitor $C_{1b}$ to $V_r$. Under the condition 5, the logic unit 13 controls the switch $S_{1b}$ to connect the other end of the capacitor $C_{1b}$ to GND. Under the condition 6, the logic unit 13 controls the switch $S_{1b}$ to connect the other end of the capacitor $C_{1b}$ to $V_{com}$.

The above condition determination is obtained by using the comparison results of the comparators 12A, 12B. For example, 0 is assigned as a digital value to the comparison result of the comparator 12A when $V_{HP}$ is equal to higher than $V_{com}$, and 1 is assigned as the digital value when $V_{HP}$ is lower than $V_{com}$. Further, when $V_{HM}$ is equal to or higher than $V_{com}$, 1 is assigned as the digital value, and when $V_{HM}$ is lower than $V_{com}$, 0 is assigned as the digital value.

In this case, the connection destination of the switch $S_{1a}$ of the capacitive DAC 11A side is decided, depending on the following conditions.

Condition 7: The output of the comparator 12A is 1 and the output of the comparator 12B is 1.
Condition 8: The output of the comparator 12A is 0 and the output of the comparator 12B is 1, or the output of the comparator 12A is 1 and the output of the comparator 12B is 0.
Condition 9: The output of the comparator 12A is 0 and the output of the comparator 12B is 0.

Under the condition 7, the logic unit 13 controls the switch $S_{1a}$ to connect the other end of the capacitor $C_{1a}$ to $V_r$. Under the condition 8, the logic unit 13 controls the switch $S_{1a}$ to connect the other end of the capacitor $C_{1a}$ to $V_{com}$. Under the condition 9, the logic unit 13 controls the switch $S_{1a}$ to connect the other end of the capacitor $C_{1a}$ to GND.

The connection destination of the switch $S_{1b}$ of the capacitive DAC 11B side is decided, depending on the following conditions.

Condition 10: The output of the comparator 12A is 1 and the output of the comparator 12B is 1.
Condition 11: The output of the comparator 12A is 0 and the output of the comparator 12B is 1, or the output of the comparator 12A is 1 and the output of the comparator 12B is 0.
Condition 12: The output of the comparator 12A is 0 and the output of the comparator 12B is 0.

Under the condition 10, the logic unit 13 controls the switch $S_{1b}$ to connect the other end of the capacitor $C_{1b}$ to GND. Under the condition 11, the logic unit 13 controls the switch $S_{1b}$ to connect the other end of the capacitor $C_{1b}$ to $V_{com}$. Under the condition 12, the logic unit 13 controls the switch $S_{1b}$ to connect the other end of the capacitor $C_{1b}$ to $V_r$.

The logic unit 13 calculates the 1.5-bit digital value based on the comparison results of the comparators 12A, 12B. In the calculation, the digital value is decided, depending on the following conditions.

Condition 13: The output of the comparator 12A is 1 and the output of the comparator 12B is 1.
Condition 14: The output of the comparator 12A is 0 and the output of the comparator 12B is 1.
Condition 15: The output of the comparator 12A is 1 and the output of the comparator 12B is 0.
Condition 16: The output of the comparator 12A is 0 and the output of the comparator 12B is 0.

The logic unit 13 calculates 1 under the condition 13. The logic unit 13 calculates 0 under the conditions 14, 15. The logic unit 13 calculates −1 under the condition 16. The calculated digital value is held in the memory 13a of the logic unit 13 as the most significant bit of the analog/digital conversion value.

Incidentally, the A/D conversion apparatus 1 according to the first embodiment uses the two comparators 12A and 12B to control the reference voltage. The outputs of the two comparators 12A, 12B each takes a value 1 or 0. Therefore, the combination of the output values of the two comparators 12A, 12B comes in four patterns 00, 10, 01, 11.

However, a digital code output by the A/D conversion apparatus 1 can take only 3 values −1, 0, 1 (1.5 bit). Therefore, in the A/D conversion apparatus 1, in order to prevent the erroneous recognition of the output values of the comparators 12A, 12B, the switches are connected to $V_{com}$ both in the "10" pattern and the "01" pattern so that the logic unit 13 shows 0 as the digital output value.

Next, the comparison phase of low-order bits will be described. First, the operation of the capacitive DAC 11A side will be described. The switch $S_{2a}$ connects the other end of the capacitor $C_{2a}$ to $V_r$. The switch $S_{4a}$ connects the other end of the capacitor $C_{4a}$ to $-V_r$. The switches $S_{3a}$, $S_{5a}$ connect the other ends of the capacitors $C_{3a}$, $C_{5a}$ to GND. At this time, let $V_{inp}=A_m$, the voltage $V_{HP}$ output from the capacitive DAC 11A is given by the following equation (7).

$$V_{HP}=-A_m+\tfrac{1}{4}V_r-\tfrac{1}{16}V_r+V_{com} \qquad (7)$$

Next, the operation of the capacitive DAC 11B side will be described. The switches $S_{2b}$, $S_{4b}$ connect the other ends of the capacitors $C_{2b}$, $C_{4b}$ to GND. The switches $S_{3b}$, $S_{5b}$ connect the other ends of the capacitors $C_{3b}$, $C_{5b}$ to $V_r$. At this time, let $V_{inm}=-A_m$, the voltage $V_{HM}$ output from the capacitive DAC 11B is given by the following equation (8).

$$V_{HM}=A_m-\tfrac{1}{4}V_r-\tfrac{1}{16}V_r+V_{com} \qquad (8)$$

Incidentally, also in this phase, as in the comparison phase of the most significant bit (MSB), the comparators 12A, 12B compare $V_{com}$ and the voltages $V_{HP}$, $V_{HM}$. The comparison results are held in the memory 13a of the logic unit 13 as the low-order bits of the analog/digital conversion value.

The logic unit 13 successively executes the above-described phase operation for the maximum capacitance C/2 to the minimum capacitance C/16. That is, in the case of 4 bits, the phase operation is performed totally four times. Finally, after the phase operation is successively executed for the maximum capacitance C/2 to the minimum capacitance C/16, the adder 13b performs the binary conversion, that is, the 1-bit conversion of the analog/digital conversion values held in the memory 13a. By this conversion, 5-bit resolution is obtained. By the foregoing operation, the A/D conversion is realized.

The A/D conversion apparatus 1 according to the first embodiment thus adopts the 1.5 bit/stage algorithm. Therefore, in order to obtain a redundant output having N bits, it is only necessary to repeat the comparison phase operation N times. Incidentally, as described above, owing to the characteristic of the 1.5 bit/stage algorithm, it is possible to obtain a binary output having N+1 bits by repeating the comparison phase operation N times.

Further, the A/D conversion apparatus 1 according to the first embodiment is influenced by a common mode noise since its voltage comparison is single-ended comparison. However, owing to the redundancy of the 1.5 bit/stage algorithm described with reference to FIG. 2, it is possible to effectively cancel the influence of the common mode noise.

Further, in spite of the need for $-V_r$ as the reference voltage, this algorithm needs a less number of A/D conversion cycles compared with the conventional redundant algorithm described with reference to FIG. 1C. Further, there is an advantage that circuit area and power consumption can be reduced.

Further, even when the A/D conversion apparatus 1 is designed with a single power source, by shifting the voltage so that the voltage of $-V_r$ becomes 0 or higher and adding the shifted voltage to $V_{com}$, $V_{inp}$, $V_{inm}$, and $V_r$, it is possible to easily generate the reference voltage operable even with the single power source.

Modification Example of First Embodiment

Figure 7:
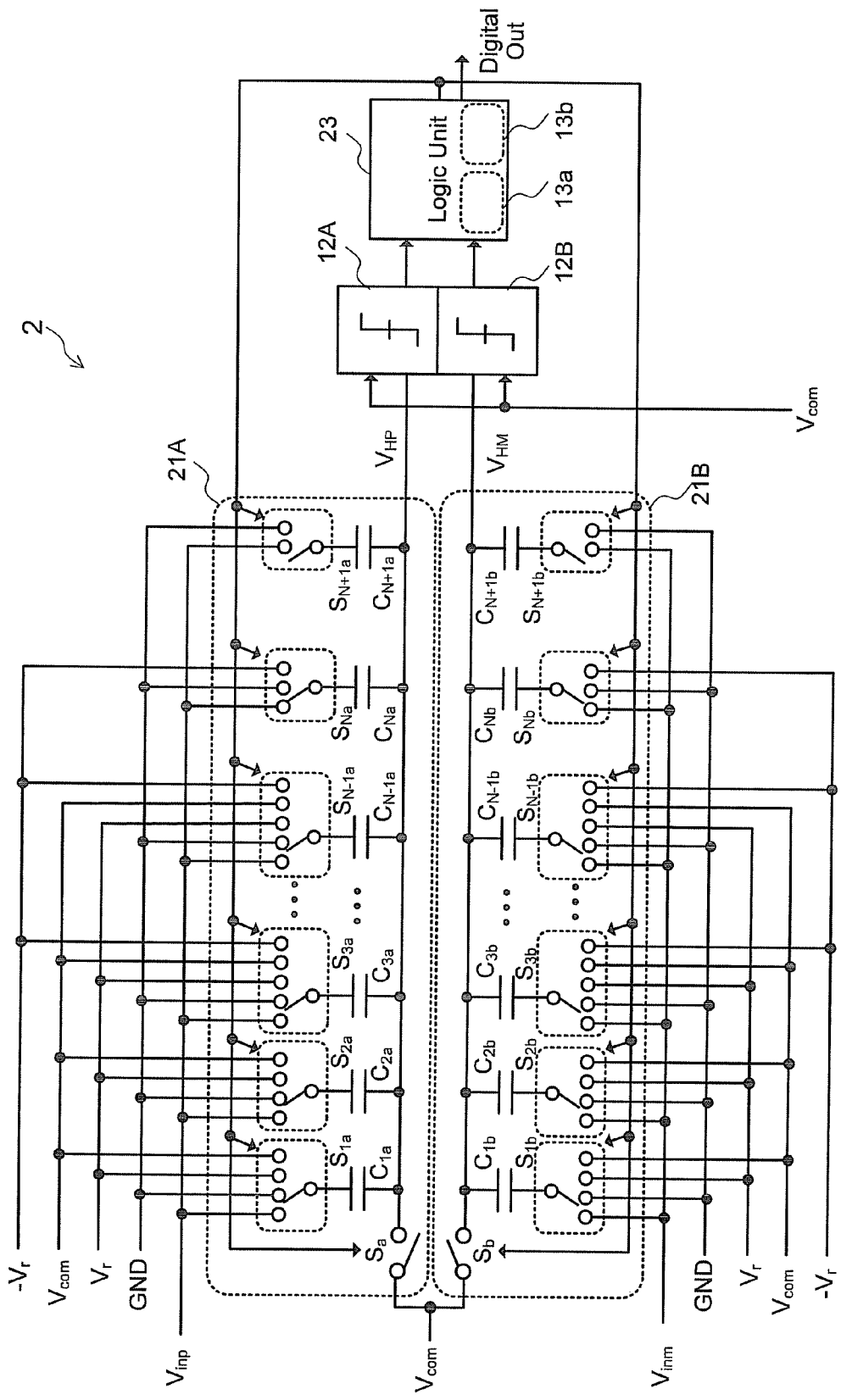
FIG. 7 is a block diagram of an A/D conversion apparatus according to a modification example of the first embodiment.

FIG. 7 is a block diagram of an A/D conversion apparatus 2 according to a modification example of the first embodiment. In the first embodiment described with reference to FIG. 3, the A/D conversion apparatus 1 whose binary equivalent resolution is 5 bits is described. In the modification example of the first embodiment, the A/D conversion apparatus 2 whose binary equivalent resolution is N+1 bits (N is a positive integer) will be described.

The A/D conversion apparatus 2 includes a capacitive DAC 21A (first D/A converter), a capacitive DAC 21B (second D/A converter), a comparator 12A, a comparator 12B, and a logic unit 23 (first converter).

The capacitive DAC 21A includes switches $S_a$, $S_{1a}$ to $S_{N+1a}$ and capacitors $C_{1a}$ to $C_{N+1a}$. One end of the switch $S_a$ is connected to $V_{com}$. The other end of the switch $S_a$ is connected to one-side ends of the capacitors $C_{1a}$ to $C_{N+1a}$.

One-side ends of the switches $S_{1a}$, $S_{2a}$ are connected to the other ends of the capacitors $C_{1a}$, $C_{2a}$. The other ends of the switches $S_{1a}$, $S_{2a}$ are connected selectively to GND, $V_{com}$, $V_r$, and $V_{imp}$.

One-side ends of the switches $S_{3a}$ to $S_{N-1a}$ are connected to the other ends of the capacitors $C_{3a}$ to $C_{N-1a}$. The other ends of the switches $S_{3a}$ to $S_{N-1a}$ are connected selectively to GND, $V_{com}$, $V_r$, $-V_r$, and $V_{imp}$.

One end of the switch $S_{Na}$ is connected to the other end of the capacitor $C_{Na}$. The other end of the switch $S_{Na}$ is connected selectively to GND, $-V_r$, and $V_{imp}$.

One end of the switch $S_{N+1a}$ is connected to the other end of the capacitor $C_{N+1a}$. The other end of the switch $S_{N+1a}$ is connected selectively to GND and $V_{imp}$.

Capacitance values of the capacitors $C_{1a}$ to $C_{N+1a}$ are binary-weighted. Capacitance ratios of the capacitors $C_{1a}$ to $C_{N+1a}$ are ½, ¼, ⅛, 1/16 ... $1/2^{N+1}$, and $1/2^{N+1}$ respectively. A unit of the capacitance is farad (F).

The connection of the switches $S_a$, $S_{1a}$ to $S_{N+1a}$ is changed according to a control signal output from the logic unit 23. The capacitive DAC 21A has a function of generating an analog voltage based on a voltage of $V_{imp}$ while holding $V_{imp}$, by changing the connection destinations of the other ends of the switches $S_a$, $S_{1a}$ to $S_{N+1a}$ according to the control signal received from the logic unit 23.

The capacitive DAC 21B includes switches $S_b$, $S_{1b}$ to $S_{N+1b}$ and capacitors $C_{1b}$ to $C_{N+1b}$. One end of the switch $S_b$ is connected to $V_{com}$. The other end of the switch $S_b$ is connected to one-side ends of the capacitors $C_{1b}$ to $C_{N+1b}$.

One-side ends of the switches $S_{1b}$, $S_{2b}$ are connected to the other ends of the capacitors $C_{1b}$, $C_{2b}$. The other ends of the switches $S_{1b}$, $S_{2b}$ are connected selectively to GND, $V_{com}$, $V_r$, and $V_{inm}$.

One-side ends of the switches $S_{3b}$ to $S_{N-1b}$ are connected to the other ends of the capacitors $C_{3b}$ to $C_{N-1b}$. The other ends of the switches $S_{3b}$ to $S_{N-1b}$ are connected selectively to GND, $V_{com}$, $V_r$, $-V_r$, and $V_{inm}$.

One end of the switch $S_{Nb}$ is connected to the other end of the capacitor $C_{Nb}$. The other end of the switch $S_{Nb}$ is connected selectively to GND, $-V_r$, and $V_{inm}$.

One end of the switch $S_{N+1b}$ is connected to the other end of the capacitor $C_{N+1b}$. The other end of the switch $S_{N+1b}$ is connected selectively to GND and $V_{inm}$.

Capacitance values of the capacitors $C_{1b}$ to $C_{N+1b}$ are binary-weighted. Capacitance ratios of the capacitors $C_{1b}$ to $C_{N+1b}$ are ½, ¼, ⅛, 1/16 ... $1/2^{N+1}$, and $1/2^{N+1}$ respectively. A unit of the capacitance is farad (F).

The connection of the switches $S_b$, $S_{1b}$ to $S_{N+1b}$ is changed according to the control signal output from the logic unit 23. The capacitive DAC 21B has a function of generating an analog voltage based on a voltage of $V_{inm}$ while holding $V_{inm}$, by changing the connection destinations of the other ends of the switches $S_b$ to $S_{N+1b}$ according to the control signal given from the logic unit 23.

The logic unit 23 includes a memory 13a storing analog/digital conversion values and an adder 13b performing 1-bit conversion of the 1.5-bit calculation result. The logic unit 23 generates the control signal controlling the switches of the capacitive DACs 21A, 21B, based on the analog/digital conversion values generated by the comparators 12A, 12B. Incidentally, another alternative structure may be that the adder 13b is not provided in the logic unit 23 and the 1-bit binary conversion is performed in an external part of the A/D conversion apparatus 2, as is the case with the A/D conversion apparatus 1 of the first embodiment.

The other constituent elements are described with reference to FIG. 3, and therefore, the same reference numerals and symbols are used to designate the same constituent elements and repeated description thereof is omitted. Further, the operation is the same as that of the A/D conversion apparatus 1 according to the first embodiment described with reference to FIG. 3 except that the phase operation is performed totally N times. The effects are the same as those of the A/D conversion apparatus 1 according to the first embodiment except that the binary equivalent resolution is N+1 bits.

Second Embodiment

Figure 8:
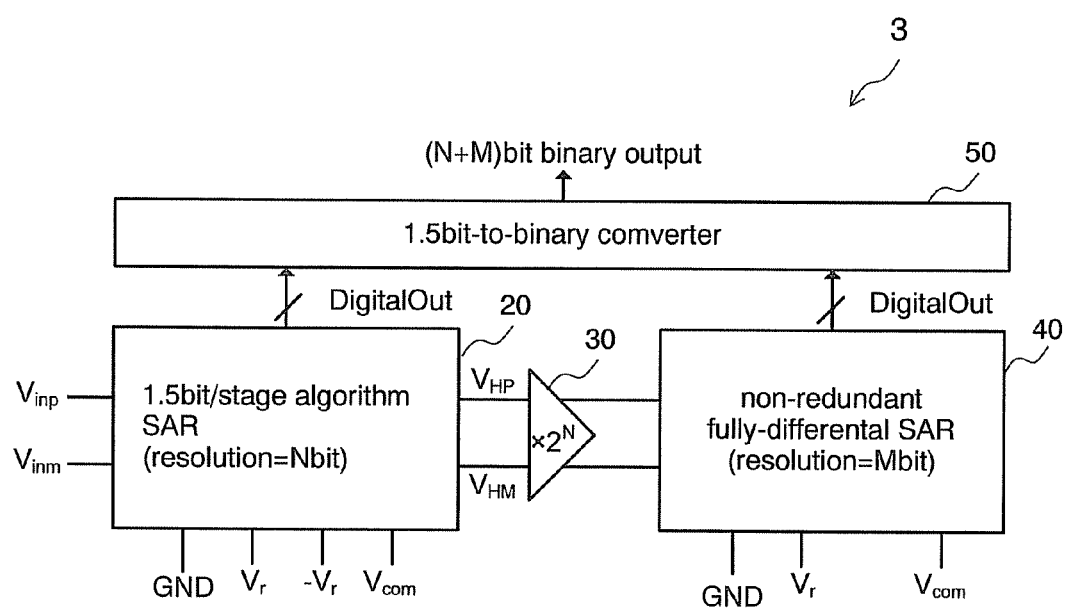
FIG. 8 is a block diagram of an A/D conversion apparatus according to a second embodiment.

FIG. 8 is a block diagram of an A/D conversion apparatus 3 according to a second embodiment. In order to realize a successive approximation type A/D converter with high resolution, it is necessary to prepare binary-weighted capacitances of a capacitive D/A converter according to the resolution. For example, an A/D converter having 11-bit resolution requires totally 1024 Cs (C is the minimum capacitance).

However, by splitting the binary-weighted capacitances of this capacitive D/A converter into two parts, it is possible to reduce the resolution per one A/D converter. For example, when the 11-bit resolution is dividedly allotted to a 5-bit A/D converter 1 and a 6-bit A/D converter 2, the total capacitance is 16C+32C=48C, so that the binary-weighted capacitance can be reduced to about 1/20.

In order to realize a successive approximation type A/D converter with high resolution, the A/D conversion apparatus 3 according to the second embodiment includes an A/D converter 20 (first A/D converter), an amplifier 30, a non-redundant fully-differential successive approximation type A/D converter 40 (hereinafter, referred to as a differential A/D converter 40: a second A/D converter), and a redundant/non-redundant converter 50.

The A/D converter 20 is a 1.5 bit/stage A/D converter that performs A/D conversion of N bits. The A/D converter 20 performs coarse A/D conversion, that is, A/D conversion of high-order bits. The amplifier 30 $2^N$-amplifies residual signals output from the A/D converter 20.

The differential A/D converter 40 receives the residual signals amplified by the amplifier 30 to perform A/D conversion of M bits. The differential A/D converter 40 performs fine A/D conversion, that is, A/D conversion of low-order bits. The redundant/non-redundant converter 50 receives digital data of the A/D converter 20 and the differential A/D converter 40 to generate binary data having N+M bits.

Figure 9:
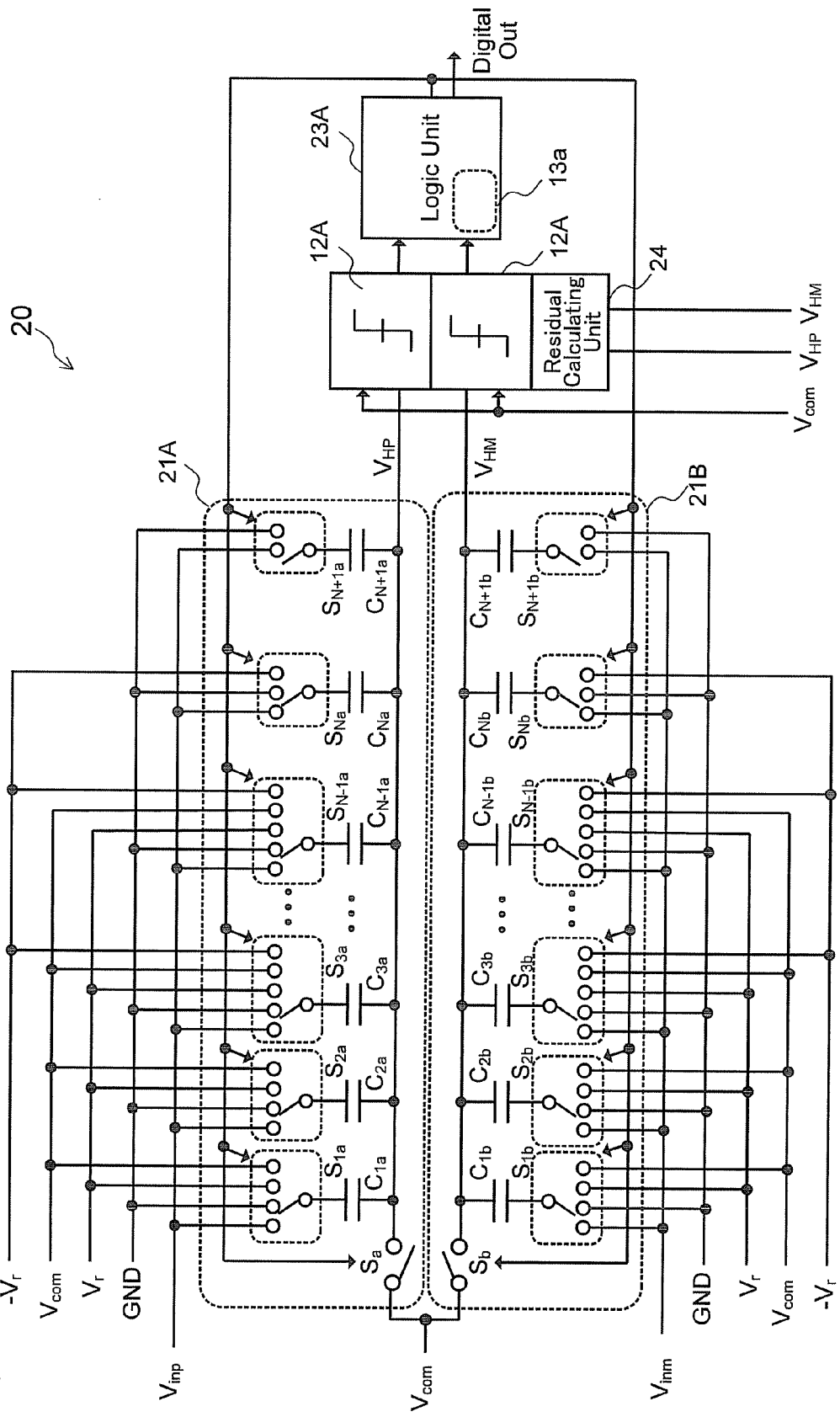
FIG. 9 is a block diagram of an A/D converter.

Next, the structure of each of the constituent elements will be described in detail. FIG. 9 is a block diagram of the A/D converter 20. The A/D converter 20 according to the second embodiment is different from the A/D conversion apparatus 2 described with reference to FIG. 7 in that a residual calculating unit 24 (residual signal generator) is provided and a logic unit 23A does not include the adder 13b.

The residual calculating unit 24 generates signals of residual components from input voltages $V_{imp}$ (plus: positive side) and $V_{inm}$ (minus: negative side) of an analog signal and analog/digital conversion values. The calculation of the residual signals by the residual calculating unit 24 can be realized by, for example, appropriate combination of capacitors that capacitive DACs 21A, 21B have. The other constituent elements are described with reference to FIG. 7 and therefore repeated description thereof will be omitted.

Figure 10:
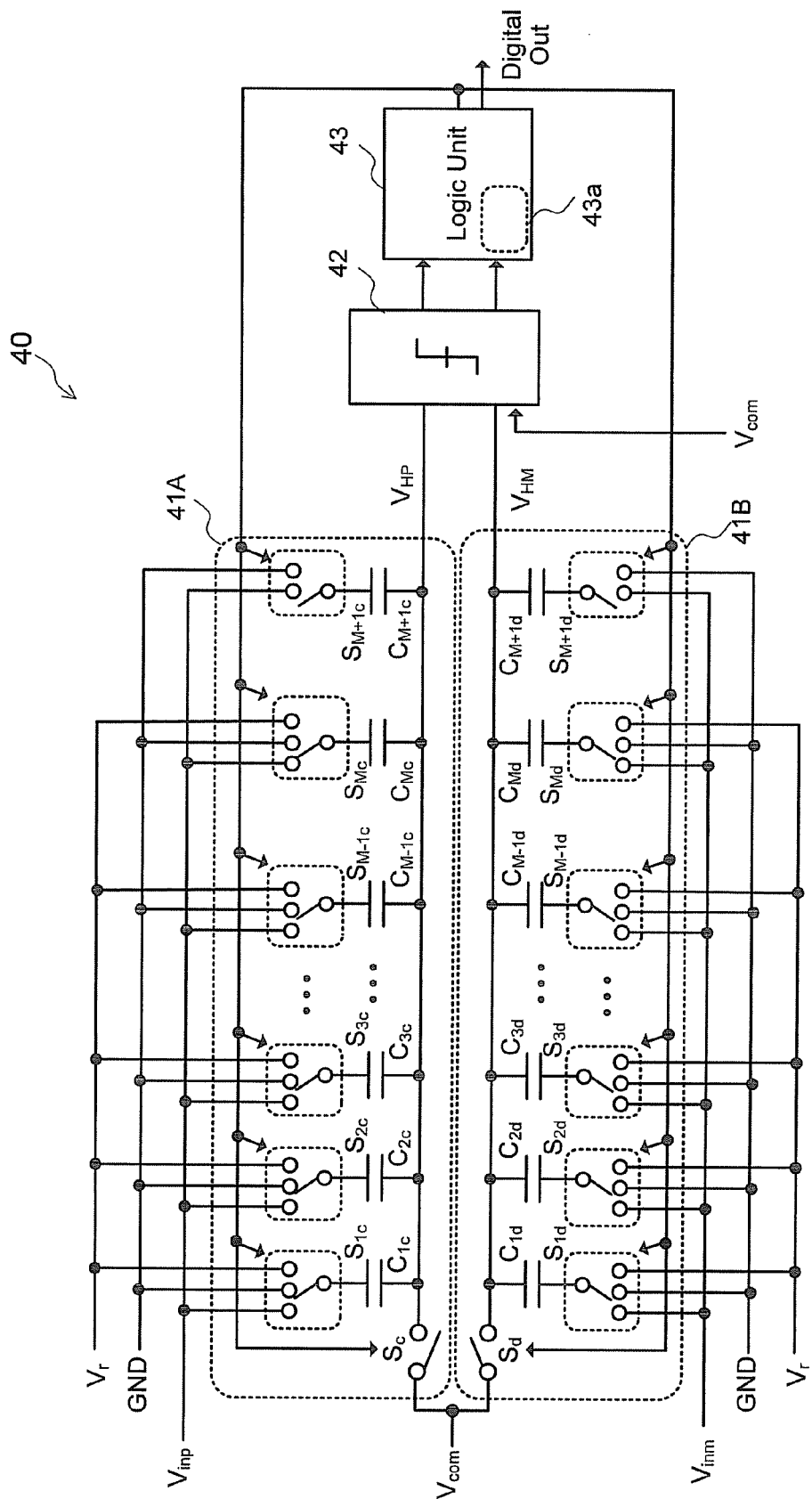
FIG. 10 is a block diagram of a differential A/D converter.

FIG. 10 is a block diagram of the differential A/D converter 40. The differential A/D converter 40 includes a capacitive DAC 41A (third D/A converter), a capacitive DAC 41B (fourth D/A converter), a comparator 42, and a logic unit 43. The comparator 42 and the logic unit 43 formed a second converter.

The capacitive DAC 41A includes switches $S_c$, $S_{1c}$ to $S_{M+1c}$ and capacitors $C_{1a}$ to $C_{M+1c}$. One end of the switch $S_c$ is connected to $V_{com}$ supplying a reference voltage. The other end of the switch $S_c$ is connected to one-side ends of the capacitors $C_{1c}$ to $C_{M+1c}$.

One-side ends of the switches $S_{1c}$ to $S_{Mc}$ are connected to the other ends of the capacitors $C_{1c}$ to $C_{Mc}$. The other ends of the switches $S_{1c}$ to $S_{Mc}$ are connected selectively to GND, $V_r$ supplying a reference voltage, and $V_{inp}$.

One end of the switch $S_{M+1c}$ is connected to the other end of the capacitor $C_{M+1c}$. The other end of the switch $S_{M+1c}$ is connected selectively to GND and $V_{inp}$.

Capacitance values of the capacitors $C_{1c}$ to $C_{M+1c}$ are binary-weighted. Capacitance ratios of the capacitors $C_{1c}$ to $C_{M+1c}$ are ½, ¼, ⅛, 1/16 ... $½^{M+1}$, and $½^{M+1}$ respectively. A unit of the capacitance is farad (F).

The connection of the switches $S_c$, $S_{1c}$ to $S_{M+1c}$ is changed according to a control signal output from the logic unit 43. The capacitive DAC 41A has a function of generating an analog voltage $V_{HP}$ (third comparison signal) based on a voltage of $V_{inp}$ while holding $V_{inp}$, by changing the connection destinations of the other ends of the switches $S_c$, $S_{1c}$ to $S_{M+1c}$ according to the control signal given from the logic unit 43.

The capacitive DAC 41B includes switches $S_d$, $S_{1d}$ to $S_{M+1d}$ and capacitors $C_{1d}$ to $C_{M+1d}$. One end of the switch $S_d$ is connected to $V_{com}$ supplying the reference voltage. The other end of the switch $S_d$ is connected to one-side ends of the capacitors $C_{1d}$ to $C_{M+1d}$.

On-side ends of the switches $S_{1d}$ to $S_{Md}$ are connected to the other ends of the capacitors $C_{1d}$ to $C_{Md}$. The other ends of the switches $S_{1d}$ to $S_{Md}$ are connected selectively to GND, $V_r$, and $V_{inm}$.

One end of the switch $S_{M+1d}$ is connected to the other end of the capacitor $C_{M+1d}$. The other end of the switch $S_{M+1d}$ is connected selectively to GND and $V_{inm}$.

Capacitance values of the capacitors $C_{1d}$ to $C_{M+1d}$ are binary-weighted. Capacitance ratios of the capacitors $C_{1d}$ to $C_{M+1d}$ are ½, ¼, ⅛, 1/16 ... $½^{M+1}$, and $½^{M+1}$ respectively. A unit of the capacitance is farad (F).

The connection of the switches $S_d$, $S_{1d}$ to $S_{M+1d}$ is changed according to the control signal output from the logic unit 43. The capacitive DAC 41B has a function of generating an analog voltage $V_{HM}$ (fourth comparison signal) based on a voltage of $V_{inm}$ while holding $V_{inm}$, by changing the connection destinations of the other ends of the switches $S_d$, $S_{1d}$ to $S_{M+1d}$ according to the control signal given from the logic unit 43.

The comparator 42 compares the analog voltages generated by the capacitive DAC 41A and the capacitive DAC 41B with a benchmark voltage $V_{com}$ (benchmark signal) to generate analog/digital conversion values each having a value of 1 or 0.

The logic unit 43 includes a memory 43a storing the analog/digital conversion values. The logic unit 43 generates the control signal controlling the switches of the capacitive DACs 41A, 41B, based on the analog/digital conversion values generated by the comparator 42.

Next, the operation will be described. The A/D converter 20 executes the operations of the sample phase, the hold phase, and the comparison phase described with reference to FIG. 4A to FIG. 6B to performthe analog/digital conversion of N bits. The conversion result of the A/D converter 20 is output to the redundant/non-redundant converter 50 as a 1.5-bit digital signal. The residual signals are output to the amplifier 30 from the residual calculating unit 24.

The amplifier 30 amplifies the residual signals output from the residual calculating unit 24 of the A/D converter 20 by $2^N$.

The differential A/D converter 40 A/D-converts the residual signals amplified by the amplifier 30. Here, the operation of the differential A/D converter 40 will be described with reference to FIG. 11A to FIG. 13B. In FIG. 11A to FIG. 13B, the illustration of the switches is omitted.

The differential A/D converter 40 of the A/D conversion apparatus 3 according to the second embodiment operates to repeat the three phases: the signal sample phase, the hold phase, and the comparison phase shown in FIG. 11A to FIG. 13B. The switches included in the capacitive DACs 41A, 41B of the differential A/D converter 40 operate according to the control signal from the logic unit 43.

Figure 11A:
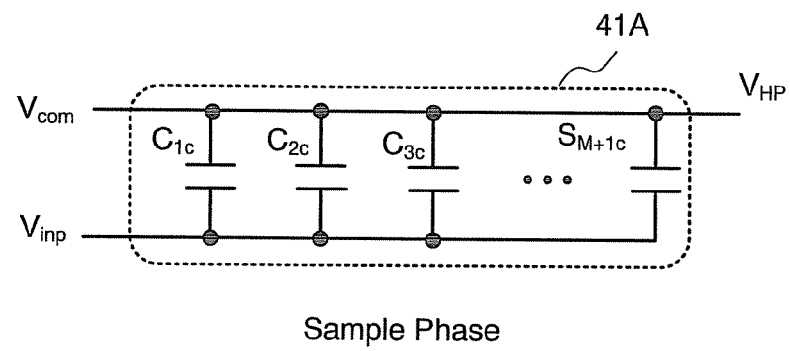
FIG. 11A is a view showing a capacitive DAC in a sample phase.

First, the operation of the capacitive DAC 41A side will be described. As shown in FIG. 11A, in the signal sample phase, the switch $S_c$ connects the one-side ends of the capacitors $C_{1c}$ to $C_{M+1c}$ to $V_{com}$. The switches $S_{1c}$ to $S_{M+1c}$ connect the other ends of the capacitors $C_{1c}$ to $C_{M+1c}$ to $V_{inp}$.

At this time, electric charge Qc accumulated in the capacitors $C_{1c}$ to $C_{M+1c}$ is given by the following equation (9), where Cc is the total capacitance of the capacitors.

$$Qc = Cc(V_{inp} - V_{com}) \tag{9}$$

Figure 11B:
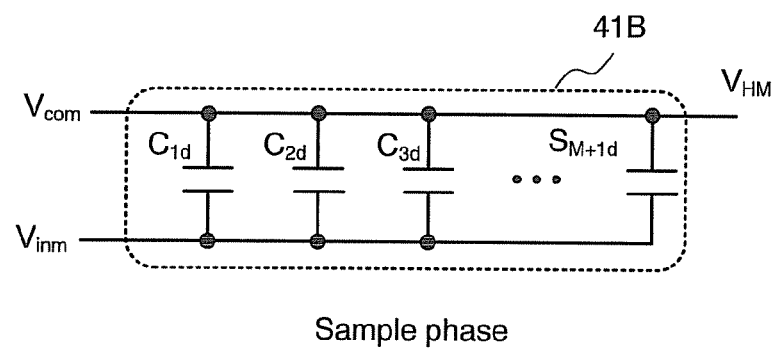
FIG. 11B is a view showing a capacitive DAC in the sample phase.

Next, the operation of the capacitive DAC 41B side will be described. As shown in FIG. 11B, in the signal sample phase, the switch $S_d$ connects the one-side ends of the capacitors $C_{1d}$ to $C_{M+1d}$ to $V_{com}$. The switches $S_{1d}$ to $S_{M+1d}$ connect the other ends of the capacitors $C_{1d}$ to $C_{M+1d}$ to $V_{inm}$.

At this time, electric charge Qd accumulated in the capacitors $C_{1d}$ to $C_{M+1d}$ is given by the following equation (10), where Cd is the total capacitance of the capacitors.

$$Qd = Cd(V_{inm} - V_{com}) \tag{10}$$

Figure 12A:
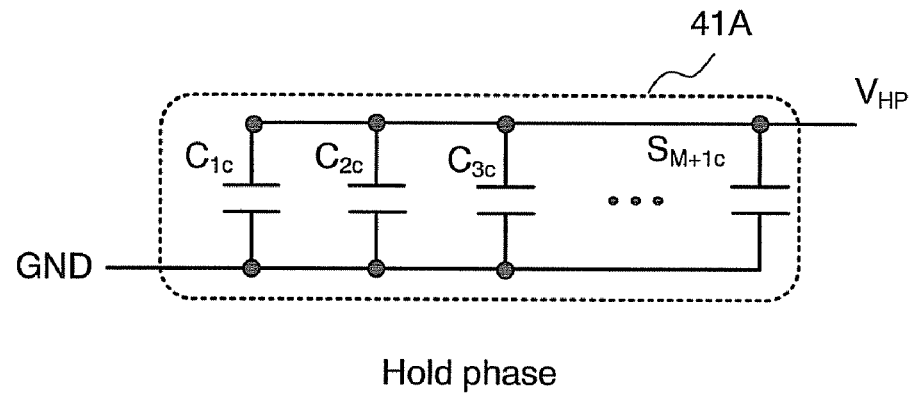
FIG. 12A is a view showing the capacitive DAC in a hold phase.

First, the operation of the capacitive DAC 41A side will be described. As shown in FIG. 12A, in the hold phase, the switch $S_c$ turns off the connection between the one-side ends of the capacitors $C_{1c}$ to $C_{M+1c}$ and $V_{com}$. The switches $S_{1c}$ to $S_{M+1c}$ connect the other ends of the capacitors $C_{1c}$ to $C_{M+1c}$ to GND.

Figure 12B:
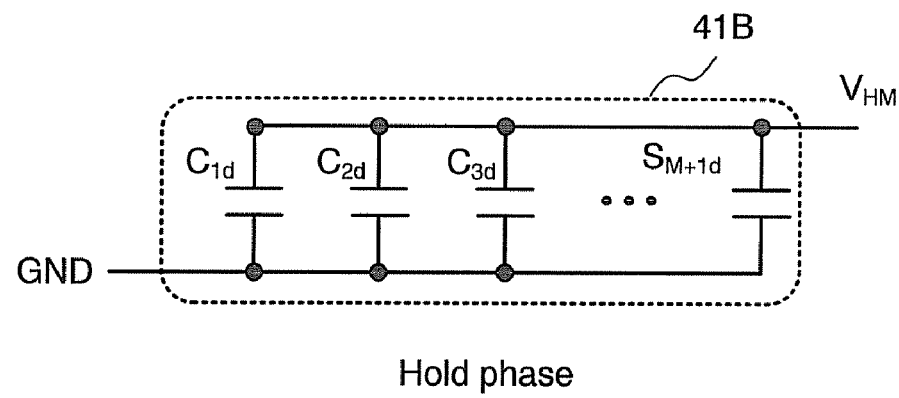
FIG. 12B is a chart showing the capacitive DAC in the hold phase.

Next, the operation of the capacitive DAC 41B side will be described. As shown in FIG. 12B, in the hold phase, the switch $S_d$ turns off the connection between the one-side ends of the capacitors $C_{1d}$ to $C_{M+1d}$ and $V_{com}$. The switches $S_{1d}$ to $S_{M+1d}$ connect the other ends of the capacitors $C_{1d}$ to $C_{M+1d}$ to GND.

Figure 13A:
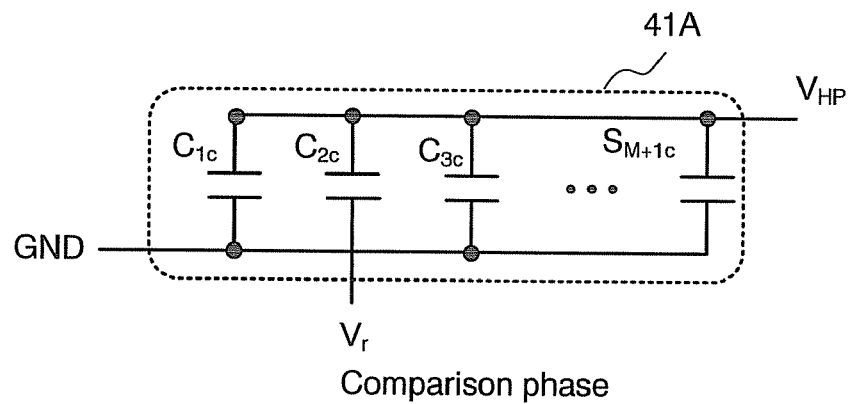
FIG. 13A is a view showing the capacitive DAC in a comparison phase.

First, the operation of the capacitive DAC 41A side will be described. As shown in FIG. 13A, the switch $S_{1c}$ connects the other end of the capacitor $C_{1c}$ to $V_r$. The switches $S_{2c}$ to $S_{M+1c}$ connect the other ends of the capacitors $C_{2c}$ to $C_{M+1c}$ to GND. At this time, the voltage $V_{HP}$ output from the capacitive DAC 41A is given by the following equation (11).

$$V_{HP} = -V_{inp} + \tfrac{1}{2} V_r + V_{com} \tag{11}$$

Figure 13B:
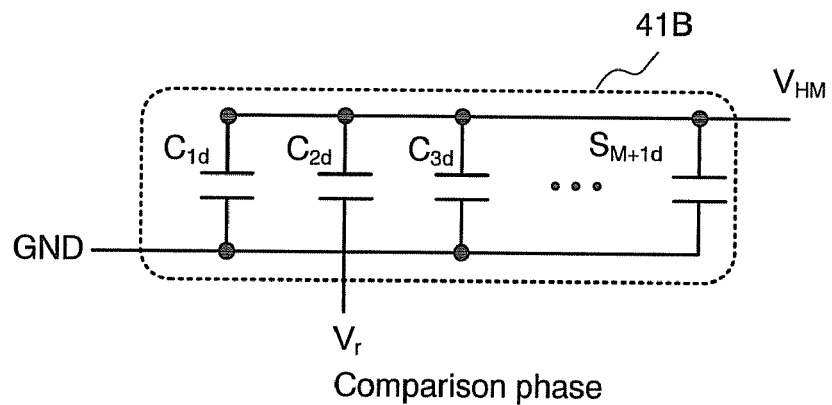
FIG. 13B is a view showing the capacitive DAC in the comparison phase.

Next, the operation of the capacitive DAC 41B side will be described. As shown in FIG. 13B, the switch $S_{1d}$ connects the other end of the capacitor $C_{1d}$ to $V_r$. The switches $S_{2d}$ to $S_{M+1d}$ connect the other ends of the capacitors $C_{2d}$ to $C_{M+1d}$ to GND.

At this time, the voltage $V_{HM}$ output from the capacitive DAC 41B is given by the following equation (12).

$$V_{HM} = -V_{inm} + \tfrac{1}{2}V_r + V_{com} \tag{12}$$

Next, the comparator 42 compares a difference $V_{diff}$ between $V_{HP}$ and $V_{HM}$ with $V_{com}$. The comparator 42 outputs a digital value "1" when $V_{diff}$ is equal to or more than $V_{com}$. On the other hand, the comparator 42 outputs a digital value "0" when $V_{diff}$ is lower than $V_{com}$. The comparison result is held in the memory 43a of the logic unit 43.

The logic unit 43 receives the analog/digital conversion result of the comparator 42, and when the conversion result is "1", it keeps connecting the switch $S_{1c}$ of the capacitive DAC 41A and the switch $S_{1d}$ of the capacitive DAC 41B to $V_r$, and when the conversion result is "0", the logic unit 43 changes the connection destination of the switch $S_{1c}$ of the capacitive DAC 41A and the switch $S_{1d}$ of the capacitive DAC 41B from $V_r$ to GND.

The logic unit 43 successively executes the above-described comparison phase operation for the maximum capacitance C/2 to the minimum capacitance $\tfrac{1}{2}^{M+1}C$. For example, when M is 4, the above-described phase operation is performed totally four times. After the A/D conversion of M bits, the differential A/D converter 40 outputs the conversion result to the redundant/non-redundant converter 50.

The redundant/non-redundant converter 50 generates the binary data having N+M bits by setting the conversion results in the A/D converter 20 as the high-order bits and setting the conversion results in the differential A/D converter 40 as the low-order bits. Incidentally, the redundant/non-redundant converter 50 converts the 1.5-bit digital data output from the A/D converter 20 to 1-bit binary data by using an adder and thereafter generates the binary data having N+M bits.

As described above, in the second embodiment, the A/D converter 20 for coarse calculation and the differential A/D converter 40 for fine calculation are provided. This can effectively reduce the circuit area of the A/D conversion apparatus 3.

Incidentally, since the A/D conversion apparatus 3 according to the second embodiment includes the amplifier 30, its circuit area increases by an area of the amplifier 30. However, since the capacitors (capacitances) of the capacitive DACs occupy most of the circuit area, the increase in the circuit area due to the inclusion of the amplifier 30 is almost negligible.

Further, in the second embodiment, the A/D converter 20 having redundancy as a front-stage circuit and the differential A/D converter 40 constituted by a fully-differential circuit as a rear-stage circuit are connected in cascade. Therefore, resistance against the common mode noise can be improved.

Specifically, though having high redundancy, the A/D converter adopting the 1.5 bit/stage algorithm is influenced by the common mode noise. However, since the rear-stage circuit is constituted by the fully-differential circuit, it is possible to completely cancel the influence of the common mode noise if there is no mismatch of differential components in the circuit.

Further, even if there is a differential mismatch in the circuit, the outputs of the amplifier outputting the residual signals are generally fed back so that the common mode is accurately set (common mode feedback), and thus the common mode noise of an output end voltage of the amplifier is reduced. Therefore, the influence of the common mode noise can be made smaller than that of the circuits in FIG. 3 and FIG. 7.

In the second embodiment, the description is given of the embodiment in which the two successive approximation type A/D converters are connected in cascade so as to sandwich the one amplifier. However, the numbers of the amplifiers and the A/D converters connected in cascade are not limited.

Third Embodiment

Figure 14:
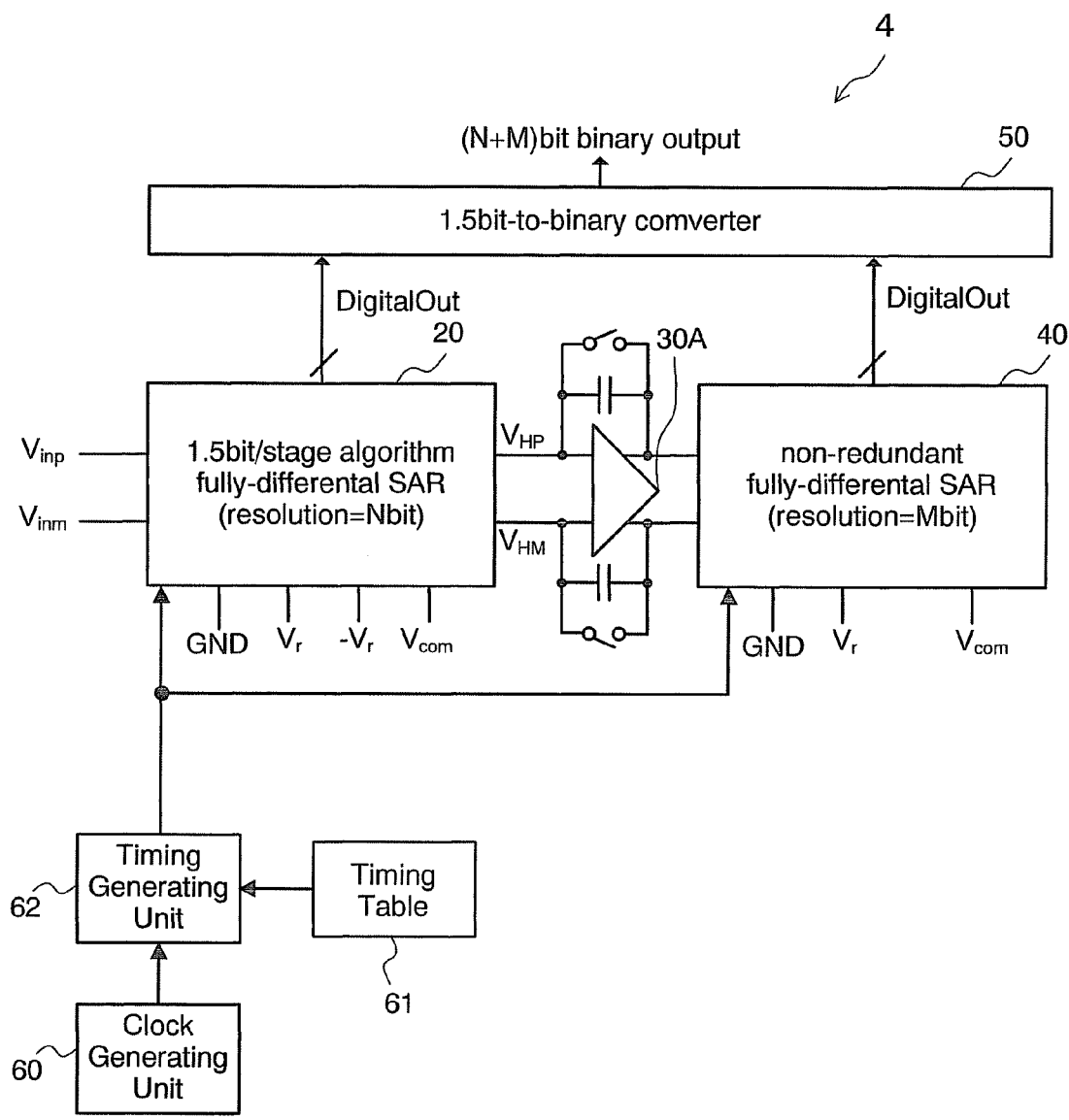
FIG. 14 is a block diagram of an A/D conversion apparatus according to a third embodiment.

FIG. 14 is a block diagram of an A/D conversion apparatus 4 according to a third embodiment. In the A/D conversion apparatus 4 according to the third embodiment, the operation timings of two A/D conversion apparatuses forming a pipelined successive approximation type A/D conversion apparatus are controlled, whereby the A/D conversion apparatus on the first stage is assigned a plurality of functions, which reduces an area required for the circuit configuration while realizing high speed.

The A/D conversion apparatus 4 according to the third embodiment includes an A/D converter 20, an amplifier 30A, a differential A/D converter 40, a redundant/non-redundant converter 50, a clock generating unit 60, a timing table 61, and a timing generating unit 62. The clock generating unit 60, the timing table 61, and the timing generating unit 62 constitute a timing control unit.

The amplifier 30A is a switched-capacitor negative-feedback amplifier composed of capacitors, switches, and an amplifier realizing the operation of amplifying output signals of the A/D converter 20 by G. Here, G is an amplification factor.

Here, a value used as a feedback capacitance of the amplifier depends on the total capacitance of capacitive D/A converters. For example, when the total capacitance is K×C and the amplification factor is G, the feedback capacitance is (K/N)×C.

According to a negative feedback principle, the larger a gain of an amplifier is, the smaller an error is. By realizing a very high gain, it is possible to obtain an amplification factor of approximately G as the gain of a feedback amplifier even if design parameters slightly vary at the time of the manufacture. Incidentally, the amplification factor G of the amplifier 30A is $2^N$ (N is a positive integer).

The clock generating unit 60 is an oscillator generating a clock signal regulating the operation of the whole A/D conversion apparatus 4 of this embodiment. The timing table 61 is a table storing timing information indicating the operation timings of the A/D converter 20 and the differential A/D converter 40. The timing generating unit 62 has a function of generating a control clock and so on regulating the operations of the A/D converter 20 and the differential A/D converter 40 based on the clock signal given by the clock generating unit 60 and the timing information given by the timing table 61. The other constituent elements are described with reference to FIG. 8 and therefore repeated description thereof will be omitted.

Figure 15:
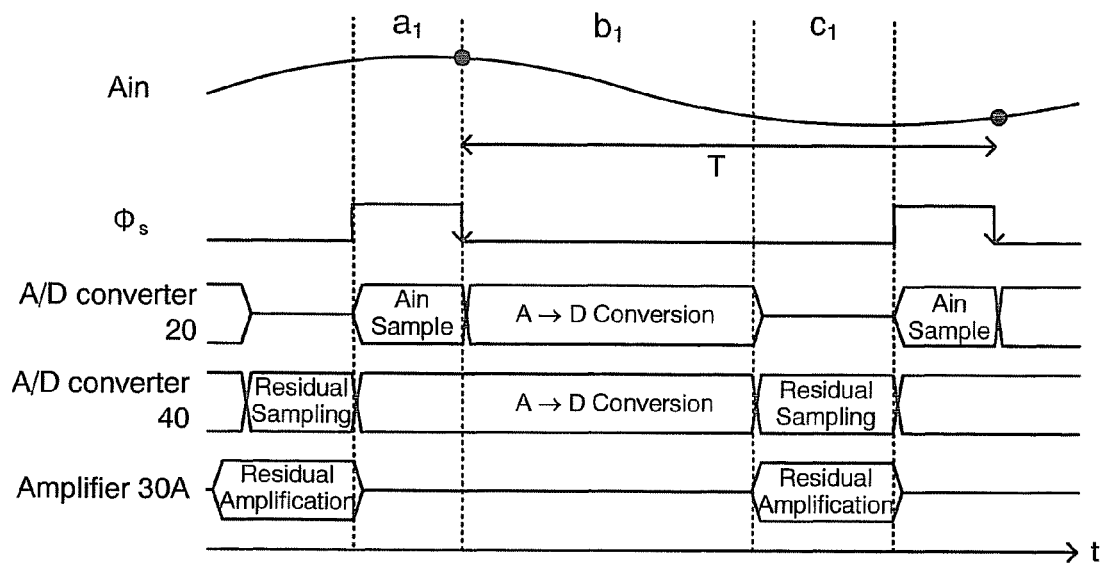
FIG. 15 is a chart showing the operation of the A/D conversion apparatus according to the third embodiment.
Figure 15:
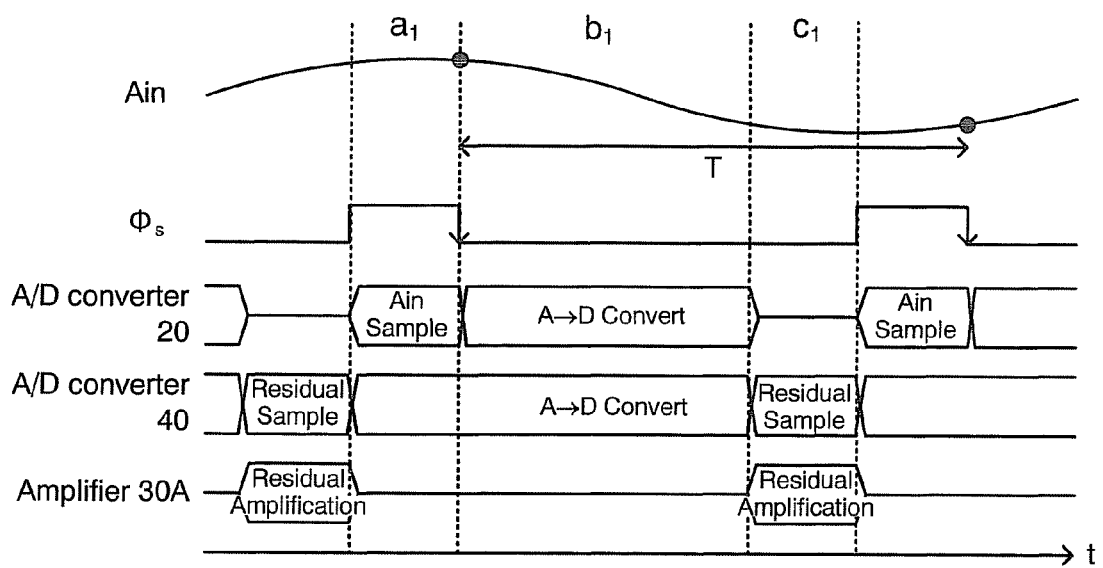

Next, the operation will be described. FIG. 15 is a timing chart used to describe the operation of the A/D conversion apparatus 4 according to the third embodiment. Operation states of the circuit elements of the A/D conversion apparatus 4 of this embodiment can be roughly divided into three. Specifically, they are a high-order bit A/D conversion phase by the A/D converter 20, a residual amplification phase by the amplifier 30A, and a low-order bit A/D conversion phase by the differential A/D converter 40. In the A/D conversion apparatus 4 of this embodiment, the timing generating unit 62 generates a control clock φs triggering the sampling of an analog signal ($A_{in}$) and a control signal (not shown) triggering the operation of each of the circuit elements.

When the timing generating unit 62 generates the control signal φs, the A/D converter 20 samples the analog input signal which is a continuous-time signal. The sampling is controlled by the control clock ϕs, and when the control clock ϕs is "1", the capacitive DACs enter a sampling state. The capacitive DACs 21A, 21B of the A/D converter 20 each have a function of holding a voltage at the time when the control clock ϕs changes from ON to OFF, for a period up to the time when the control clock ϕs becomes ON next. That is, the voltage of the analog input signal is held for a predetermined period. Incidentally, the above sampling is executed periodically.

When the control clock ϕs generated by the timing generating unit 62 becomes OFF, the circuit state then shifts to the A/D conversion phase. In the A/D conversion phase, the A/D converter 20 performs the successive A/D conversion by using the capacitive DACs 21A, 21B, comparators 22A, 22B, and a logic unit 23. The logic unit 23 stores the results of the A/D conversion in a memory 23a. Incidentally, as will be described later, during this A/D conversion phase, the differential A/D converter 40 is executing the A/D conversion processing of residual data.

Thereafter, the timing generating unit 62 sends the control signal causing the shift to the residual amplification phase, to the A/D converter 20 and the differential A/D converter 40. In the residual amplification phase, a residual calculating unit 24 calculates signals of residual components by using the input signal held by the capacitive DACs 21A, 21B and the analog/digital values.

The calculation of the residual signals by the residual calculating unit 24 is realized by, for example, appropriate combination of capacitors included in the capacitive DACs 21A, 21B.

The amplifier 30A amplifies the signals of the residual components calculated by the residual calculating unit 24 to output the residual signals. The differential A/D converter 40 samples the residual signals amplified by the amplifier 30A. The amplification of the residual signals and the sampling of the residual signals are executed during the period of the same residual amplification phase (until the timing generating unit 62 generates the control clock ϕs).

That is, the sampling by the A/D converter 20 and the sampling by the differential A/D converter 40 are executed independently at different timings. As shown in FIG. 15, during the sample phase and A/D conversion phase periods in which the A/D converter 20 performs the sampling and A/D conversion operations, the differential A/D converter 40 executes the A/D conversion processing of the residual signals. Thereafter, the A/D converter 20, the amplifier 30A, and the differential A/D converter 40 repeat the above-described operations of the sample phase, the A/D conversion phase, and the residual amplification phase. Here, the A/D converter 20 executes the analog/digital conversion of high-order N bits and the differential A/D converter 40 executes the conversion of low-order M bits.

As described above, in the A/D conversion apparatus 4 of this embodiment, the operations of the capacitive DACs 21A, 21B of the A/D converter 20 are stopped while the differential A/D converter 40 is sampling the residual signals. This means that the capacitive DACs 21A, 21B take charge of not only the sampling of the analog signal but also the generation of the residual signals for the differential A/D converter 40. This eliminates a need to newly provide a capacitive DAC for generating the residual signals.

As described above, in the A/D conversion apparatus 4 according to the third embodiment, the operation timings of the A/D converter 20 for coarse calculation and the differential A/D converter 40 for fine calculation in the pipelined successive approximation type A/D conversion apparatus are set at different timings, so that the sampling and the residual calculation by the differential A/D converter 40 for fine calculation are executed while the A/D converter 20 for coarse calculation is stopped. Therefore, there is no need to provide a capacitive DAC disposed between the two A/D converters forming the pipeline. That is, it is possible to reduce the number of capacitors for the capacitive DAC, which can reduce an area required for the circuit arrangement.

Further, since the differential A/D converter 40 on the rear stage is operated during the operation of the A/D converter 20 on the front stage, efficient A/D conversion is enabled.

Further, the A/D conversion apparatus 4 according to the third embodiment includes the switched-capacitor negative-feedback amplifier (amplifier 30A) composed of the capacitors, the switches, and the amplifier realizing the operation of $2^N$-amplifying the output signal of the A/D converter 20. Therefore, the design of the amplifier is simplified by the negative feedback operation, which makes it possible to reduce power consumption of the amplifier.

Fourth Embodiment

Figure 16:
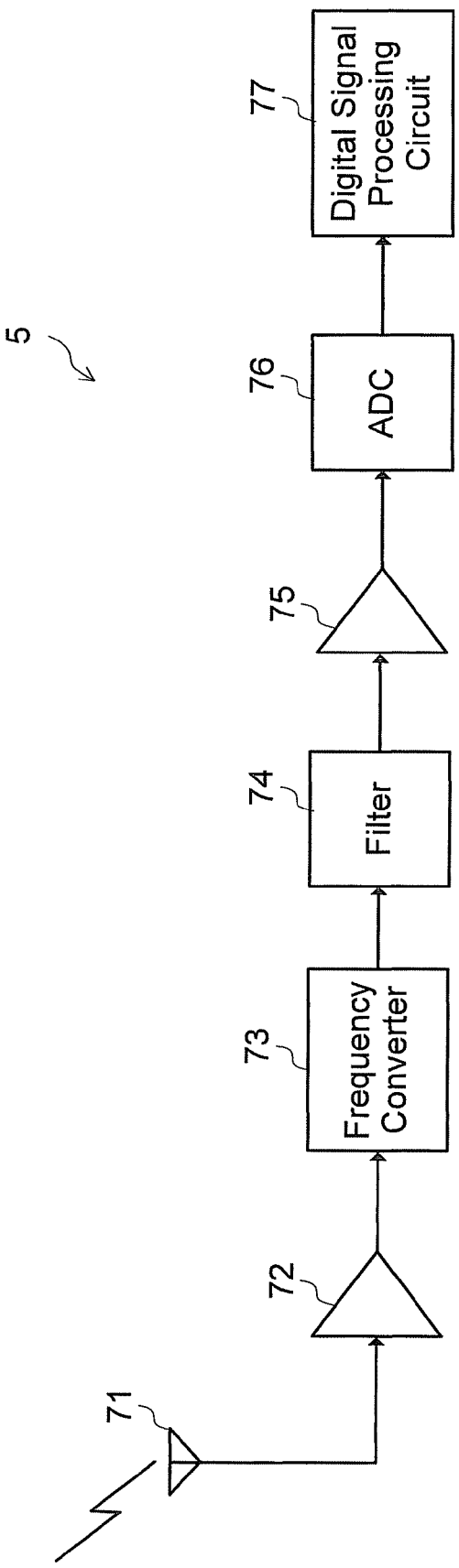
FIG. 16 is a block diagram of a communication apparatus according to a fourth embodiment.

FIG. 16 is a block diagram of a communication apparatus 5 according to a fourth embodiment. The communication apparatus 5 includes an antenna 71 (receiver), an amplifier 72, a frequency converter 73, a filter 74, a variable gain amplifier 75, an A/D conversion apparatus 76, and a digital signal processing circuit 77 (a signal processor).

The antenna 71 receives an analog signal. The amplifier 72 amplifies the analog signal received by the antenna 71. The frequency converter 73 converts the analog signal amplified by the amplifier 72 to a baseband signal. The filter 74 allows the passage of only an arbitrary frequency band of the baseband signal resulting form the conversion by the frequency converter 73. That is, an interference wave included in the baseband signal is removed.

The variable gain amplifier 75 amplifies the output signal of the filter 74 to keep its amplitude constant. The A/D conversion apparatus 76 A/D-converts the baseband signal input from the variable gain amplifier 75. The digital signal processing circuit 77 applies signal processing such as sampling rate conversion, noise removal, and demodulation to the digitally converted baseband signal input from the A/D conversion apparatus 76. Incidentally, as the A/D conversion apparatus 76, any of the A/D conversion apparatus 1 to the A/D conversion apparatus 4 described in the first to third embodiments is used.

As described above, the communication apparatus 5 according to the fourth embodiment includes, as the A/D conversion apparatus 76, any of the A/D conversion apparatus 1 to the A/D conversion apparatus 4 described in the first to third embodiments.

Therefore, when the A/D conversion apparatus 1 according to the first embodiment or the A/D conversion apparatus 2 according to the modification example is used, a binary output having N+1 bits is obtained by repeating the comparison phase operation N times, which can effectively reduce the time necessary for the A/D conversion. Further, owing to the redundancy of the 1.5/stage algorithm, it is possible to effectively cancel the influence of the common mode noise.

Further, when the A/D conversion apparatus 3 according to the second embodiment is used, since it includes the A/D converter 20 for coarse calculation and the differential A/D converter 40 for fine calculation, it is possible to reduce a binary-weighted capacitance per one A/D converter, which can effectively reduce the circuit area of the A/D conversion apparatus 3.

When the A/D conversion apparatus 4 according to the third embodiment is used, since the sampling and the residual calculation by the differential A/D converter 40 for fine calculation are executed while the A/D converter 20 for coarse calculation is stopped, there is no need to provide a capacitive DAC disposed between the two A/D converters constituting the pipeline. That is, it is possible to reduce the number of capacitors for the capacitive DAC, which can reduce the area required for the circuit arrangement.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An A/D conversion apparatus, comprising:
   a first D/A converter to sample a first analog signal and successively compare the first analog signal with a first to a third reference signals to generate a first comparison signal respectively;
   a second D/A converter to sample a second analog signal and successively compare the second analog signal with the first and the second reference signals to generate a second comparison signal respectively, the second analog signal forming a differential signal with the first analog signal;
   a first comparator to compare the first comparison signal generated by the first D/A converter with a benchmark signal;
   a second comparator to compare the second comparison signal generated by the second D/A converter with the benchmark signal; and
   a first converter to convert the first analog signal and the second analog signal to a digital signal according to results of the comparisons by the first and second comparators.

2. The A/D conversion apparatus according to claim 1,
   wherein the first converter sets a value of the digital signal to a first value when a voltage of the first comparison signal is equal to or higher than a voltage of the benchmark signal and a voltage of the second comparison signal is equal to or higher than the voltage of the benchmark signal;
   wherein the first converter sets the value of the digital signal to a second value different from the first value when the voltage of the first comparison signal is equal to or higher than the voltage of the benchmark signal and the voltage of the second comparison signal is lower than the voltage of the benchmark signal, or when the voltage of the first comparison signal is lower than the voltage of the benchmark signal and the voltage of the second comparison signal is equal to or higher than the voltage of the benchmark signal; and
   wherein the first converter sets the value of the digital signal to a third value different from the first and second values when the voltage of the first comparison signal is lower than the voltage of the benchmark signal and the voltage of the second comparison signal is lower than the voltage of the benchmark signal.

3. The A/D conversion apparatus according to claim 1, further comprising:
   a residual signal generator to generate residual signals which are differences between the first analog signal and the first comparison signal, and the second analog signal and the second comparison signal;
   a third and a fourth D/A converter to sample the residual signals and successively compare the residual signals and a reference voltage to generate a third and a fourth comparison signal respectively; and
   a second converter to convert the residual signals to a digital signal by comparing a difference between the third and fourth comparison signals with the benchmark signal.

4. The A/D conversion apparatus according to claim 3, further comprising,
   a controller to stop sampling operations of the first and second D/A converters during a period in which the third and fourth D/A converters are sampling the residual signals.

5. The A/D conversion apparatus according to claim 3,
   wherein the first and second D/A converters hold the sampled analog signal for a predetermined period.

6. The A/D conversion apparatus according to claim 3, further comprising,
   an amplifier to amplify the residual signals.

7. The A/D conversion apparatus according to claim 6,
   wherein the amplifier is a switched-capacitor negative-feedback amplifier.

8. The A/D conversion apparatus according to claim 1,
   wherein the third reference signal is different from the first and the second reference signals.

9. The A/D conversion apparatus according to claim 1,
   wherein the first reference signal has ground potential,
   wherein the second and the third reference signals have same absolute value and reverse polarity each other.

10. An A/D conversion method, comprising:
    sampling a first and a second analog signals forming a differential signal;
    successively comparing the first analog signal with a first to a third reference signals to generate a first comparison signal;
    successively comparing the second analog signal with the first and the second reference signals to generate a second comparison signal;
    comparing the first comparison signal generated by a first D/A converting unit with a benchmark value;
    comparing the second comparison signal generated by a second D/A converting unit with the benchmark value; and
    converting the analog signal to a digital signal according to results of the comparisons.

11. A communication apparatus, comprising:
    a receiver to receive a first analog signal and a second analog signal forming a differential signal;
    a first D/A converter successively to compare the first analog signal with a first to a third reference signals to generate a first comparison signal respectively;
    a second D/A converter successively to compare the second analog signal with the first and the third reference signals to generate a second comparison signal respectively;
    a first comparator to compare the first comparison signal generated by the first D/A converter with a benchmark value;
    a second comparator to compare the second comparison signal generated by the second D/A converter with the benchmark value;
    a converter to convert the first analog signal and the second analog signal to a digital signal according to results of the comparisons by the first and second comparators; and
    a signal processor to demodulate the digital signal.

* * * * *